(12) United States Patent
Otsuji et al.

(10) Patent No.: US 12,051,747 B2
(45) Date of Patent: Jul. 30, 2024

(54) SEMICONDUCTOR DEVICE

(71) Applicant: Nuvoton Technology Corporation Japan, Kyoto (JP)

(72) Inventors: Michiya Otsuji, Shiga (JP); Hironao Nakamura, Osaka (JP); Ryosuke Okawa, Nara (JP); Eiji Yasuda, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/554,141

(22) PCT Filed: Jan. 18, 2023

(86) PCT No.: PCT/JP2023/001288
§ 371 (c)(1),
(2) Date: Oct. 5, 2023

(87) PCT Pub. No.: WO2023/171137
PCT Pub. Date: Sep. 14, 2023

(65) Prior Publication Data
US 2024/0204096 A1  Jun. 20, 2024

Related U.S. Application Data

(60) Provisional application No. 63/318,965, filed on Mar. 11, 2022.

(51) Int. Cl.
*H01L 29/78* (2006.01)
*H01L 29/06* (2006.01)
*H01L 29/66* (2006.01)

(52) U.S. Cl.
CPC ...... *H01L 29/7813* (2013.01); *H01L 29/0615* (2013.01); *H01L 29/0696* (2013.01); *H01L 29/66734* (2013.01)

(58) Field of Classification Search
CPC ............ H01L 29/7813; H01L 29/0615; H01L 29/0696; H01L 29/66734
(Continued)

(56) References Cited

U.S. PATENT DOCUMENTS

2008/0001221 A1   1/2008   Yoshimura et al.
2011/0233714 A1   9/2011   Lu
(Continued)

FOREIGN PATENT DOCUMENTS

JP   2008-010723 A   1/2008
JP   2011-204710 A   10/2011
(Continued)

OTHER PUBLICATIONS

International Search Report dated Mar. 20, 2023 issued in International Patent Application No. PCT/JP2023/001288, with English translation.
(Continued)

*Primary Examiner* — Igwe U Anya
(74) *Attorney, Agent, or Firm* — Rimon P.C.

(57) ABSTRACT

A semiconductor device includes a vertical field-effect transistor including: a low-concentration impurity layer; a body region; a gate trench; a gate insulating film; and a gate conductor. The body region includes: a first body portion containing an active region and has a constant depth; and a second body portion adjacent to the first body portion and includes a zone that has a limited length in a second direction orthogonal to the first direction along the top surface of the low-concentration impurity layer, and has a constant depth at a position shallower than the constant depth of the first body portion. The second body portion includes a portion in which a region having relatively high concentration of an impurity and a region having relatively low concentration of an impurity are alternately and peri-
(Continued)

odically present in the first direction in a cross-sectional view of a plane orthogonal to the second direction.

11 Claims, 26 Drawing Sheets

(58) Field of Classification Search
USPC .......................................................... 257/330
See application file for complete search history.

(56) References Cited

U.S. PATENT DOCUMENTS

| | | |
|---|---|---|
| 2017/0012122 A1 | 1/2017 | Takaya et al. |
| 2018/0114856 A1* | 4/2018 | Nakano .................. H01L 29/12 |
| 2021/0074846 A1 | 3/2021 | Hoshi |
| 2023/0223471 A1* | 7/2023 | Oota .................. H01L 29/7813 |
| | | 257/330 |

FOREIGN PATENT DOCUMENTS

| | | |
|---|---|---|
| JP | 2015-153787 A | 8/2015 |
| JP | 2021-044275 A | 3/2021 |

OTHER PUBLICATIONS

Written Opinion of the International Searching Authority dated Mar. 20, 2023 issued in International Patent Application No. PCT/JP2023/001288, with English translation.

\* cited by examiner

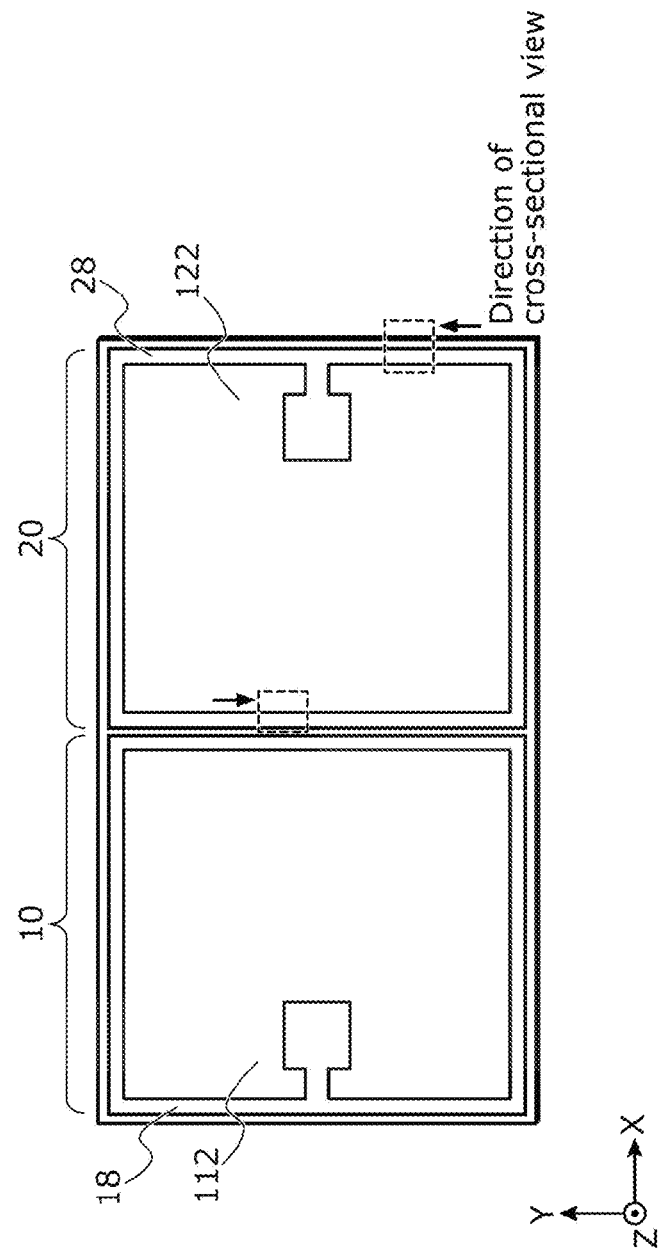

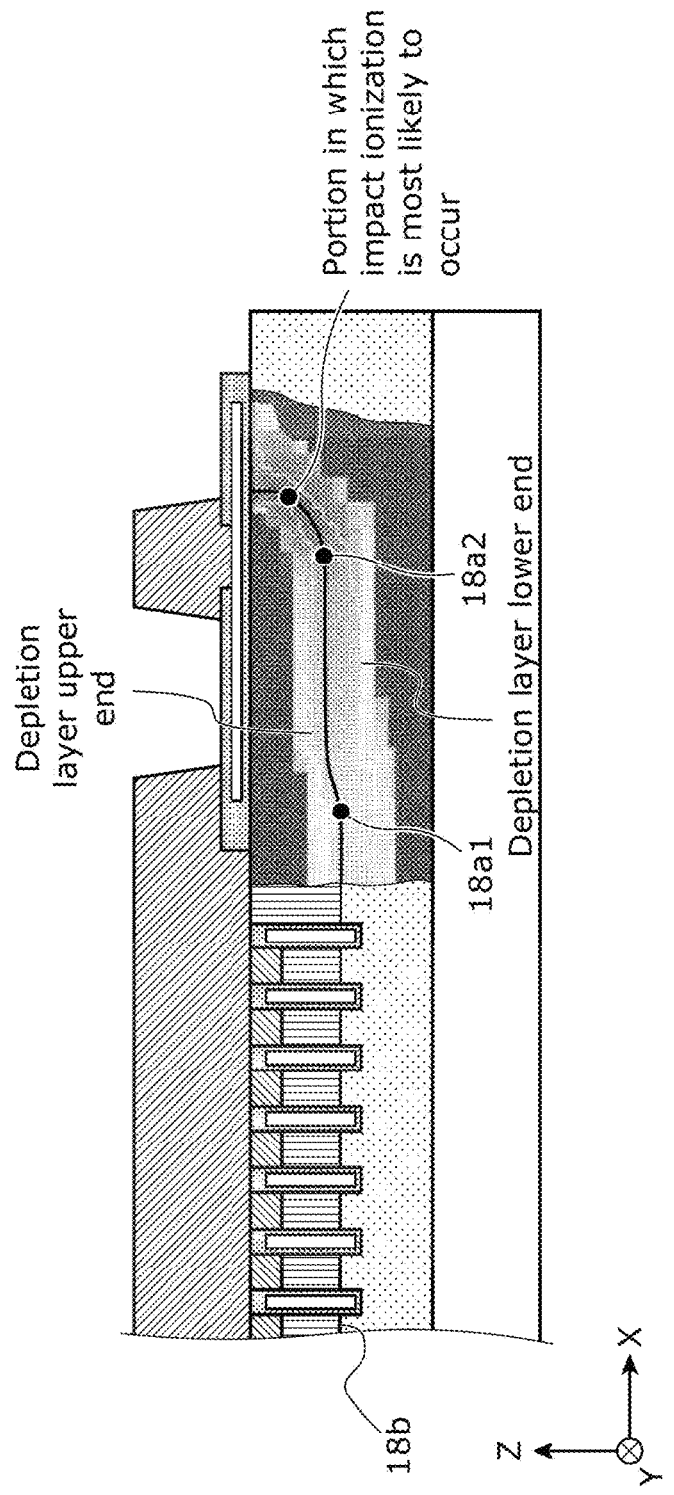

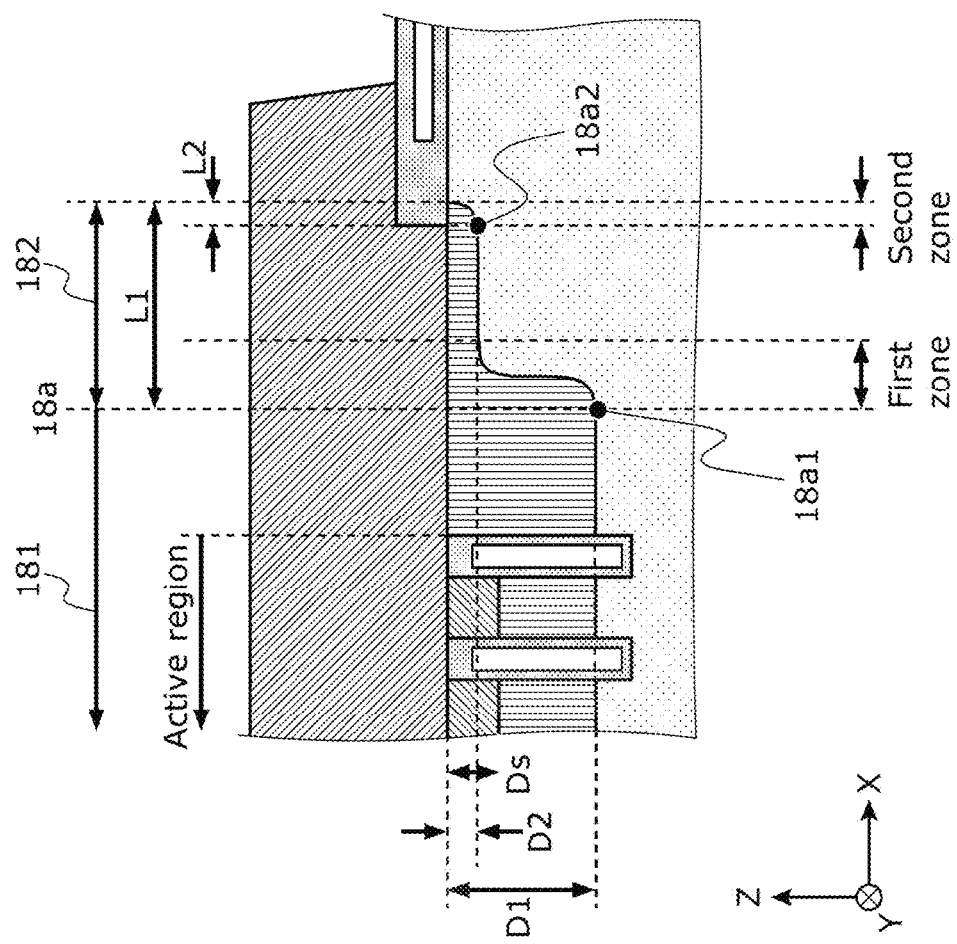

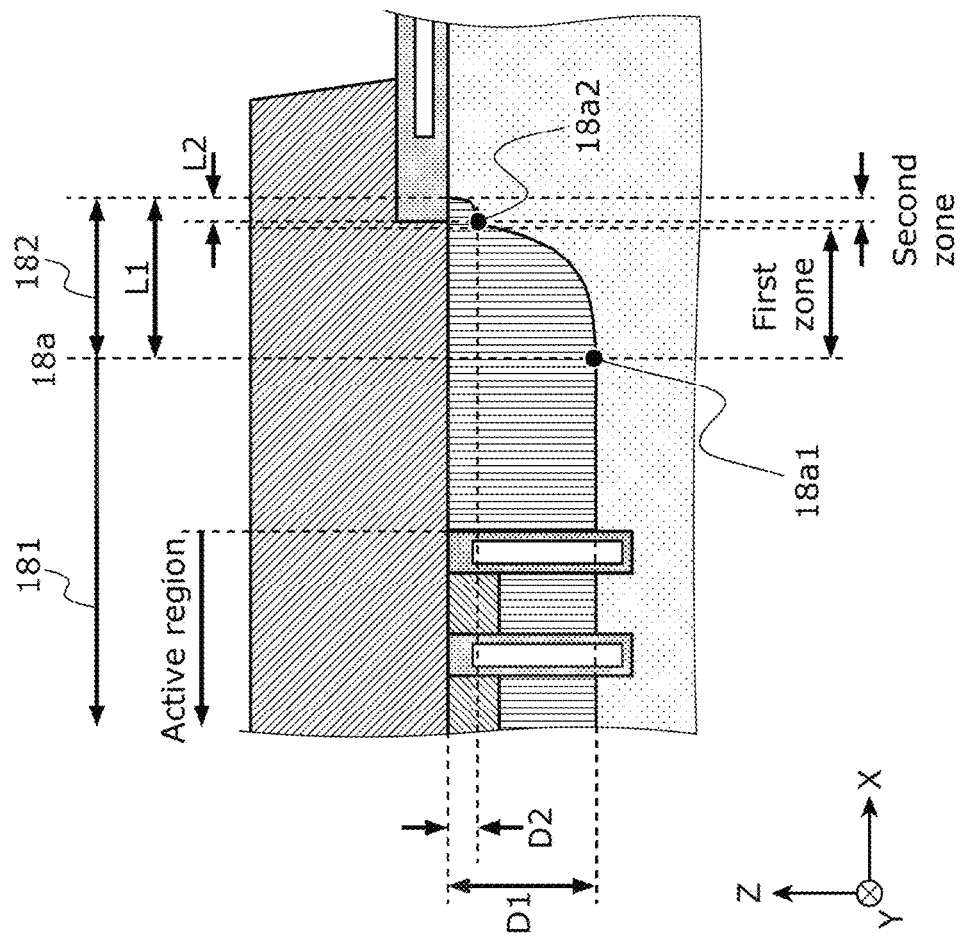

FIG. 15A1
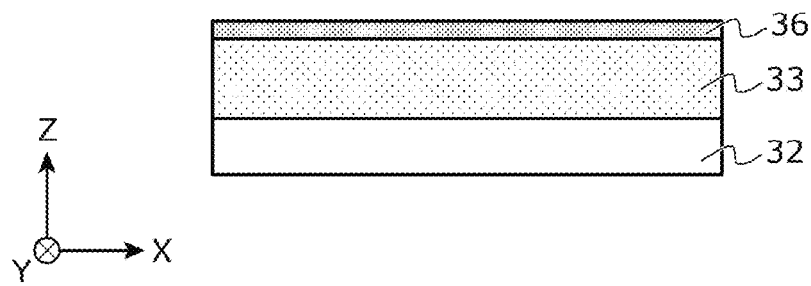
FIG. 15A2
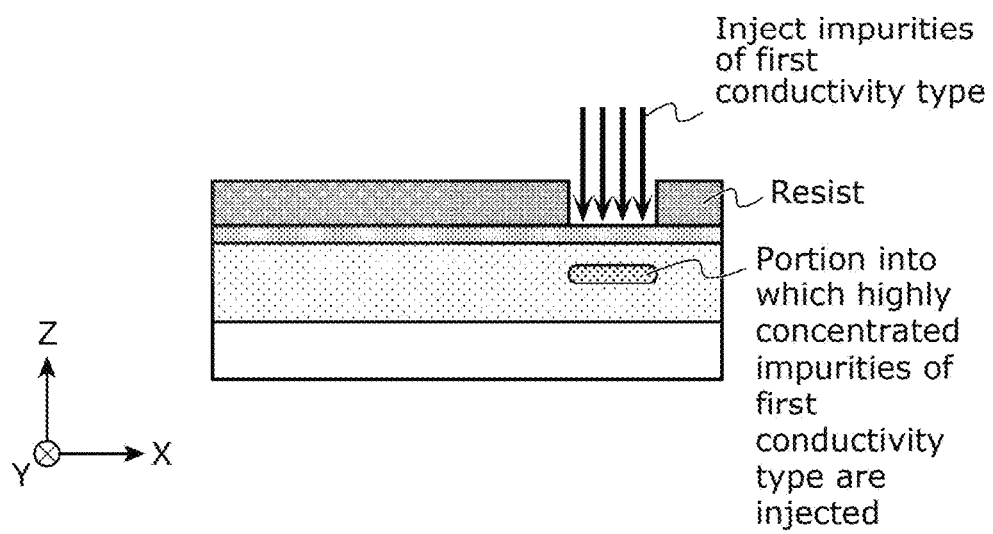
FIG. 15A3
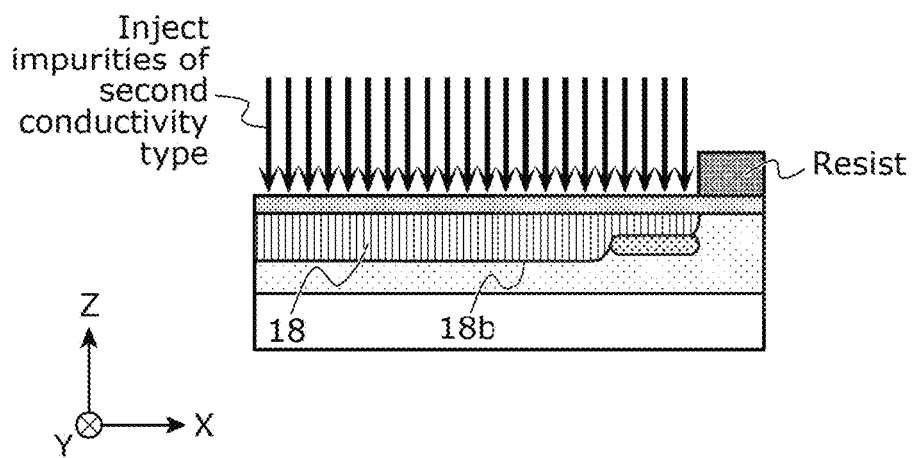

FIG. 15A4
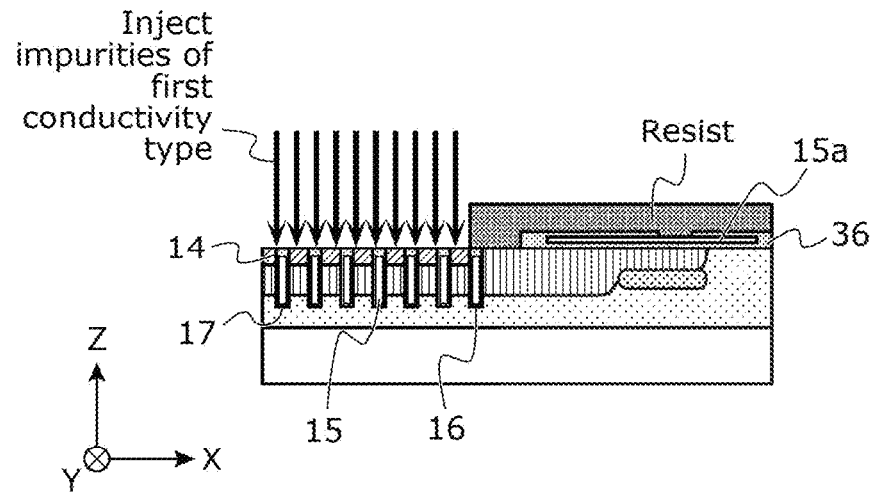
FIG. 15A5
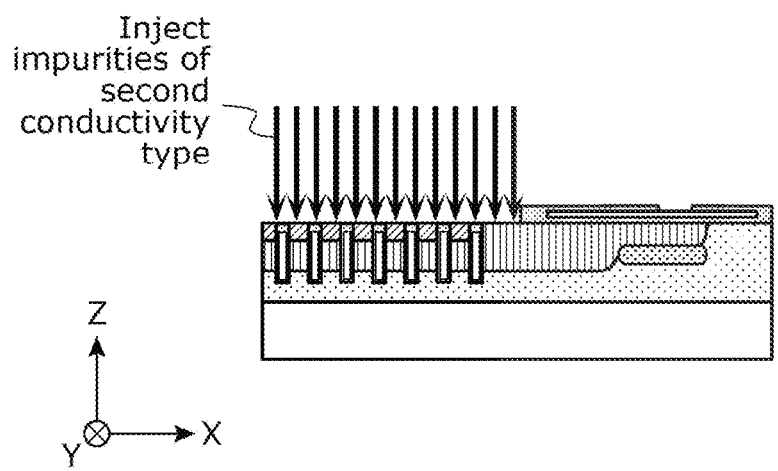
FIG. 15A6
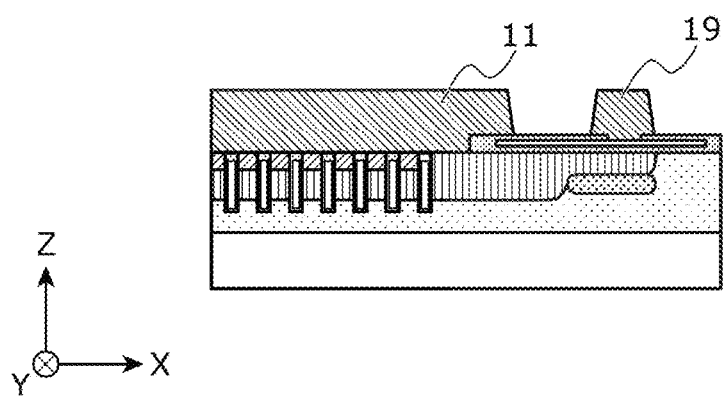

FIG. 15B1
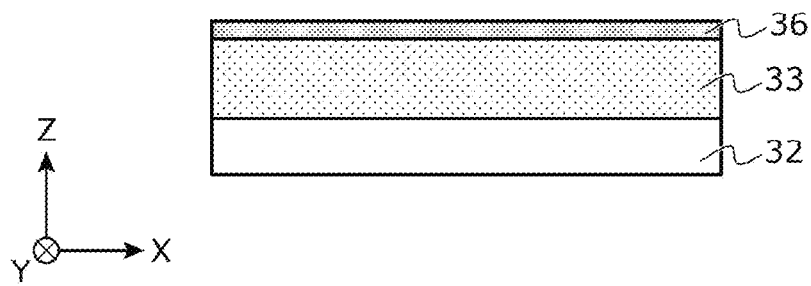
FIG. 15B2
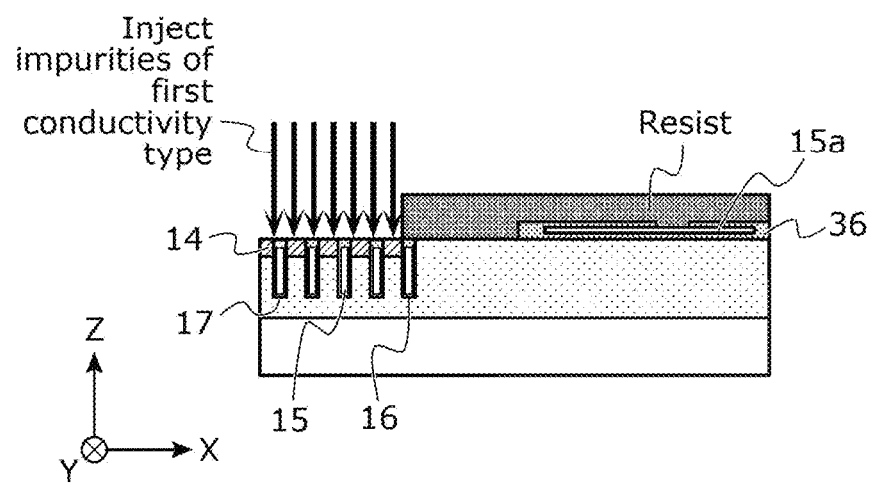
FIG. 15B3
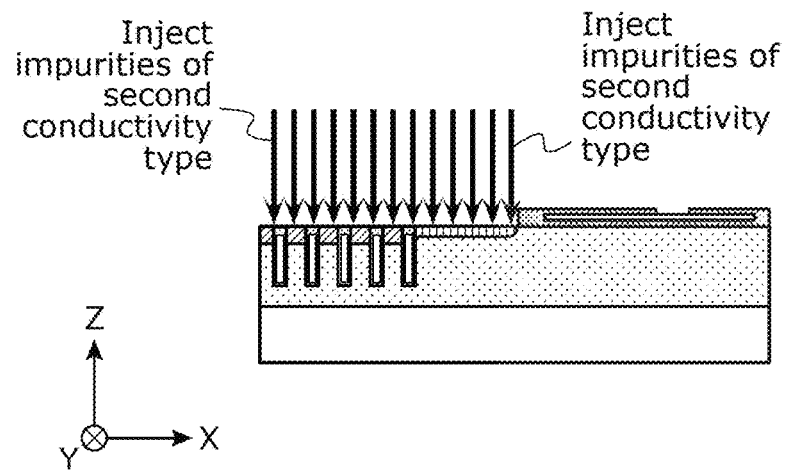

FIG. 15B4
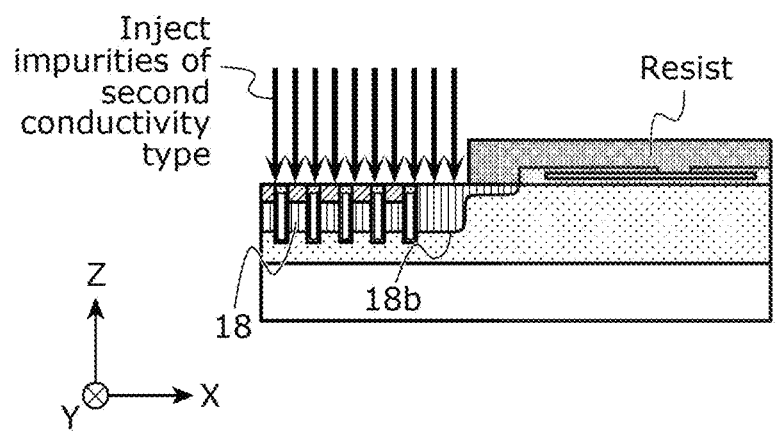
FIG. 15B5
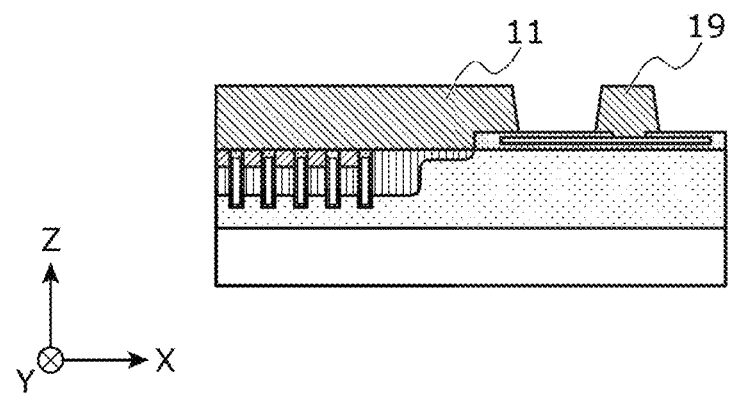

SEMICONDUCTOR DEVICE

CROSS-REFERENCE OF RELATED APPLICATIONS

This application is the U.S. National Phase under 35 U.S.C. § 371 of International Patent Application No. PCT/JP2023/001288, filed on Jan. 18, 2023, which in turn claims the benefit of U.S. Provisional Patent Application Ser. No. 63/318,965, filed on Mar. 11, 2022, the entire disclosures of which Applications are incorporated by reference herein.

TECHNICAL FIELD

The present disclosure relates to a semiconductor device and, in particular, to a chip-size-package type semiconductor device.

BACKGROUND ART

There has been a demand for stabilizing a breakdown voltage in a vertical field-effect transistor.

CITATION LIST

Patent Literature

[PTL 1] Japanese Unexamined Patent Application Publication No. 2008-10723

SUMMARY OF INVENTION

Technical Problem

A maximum voltage at which safe driving of a vertical field-effect transistor is guaranteed and that can be applied between the drain and the source is described in product specification, and is referred to as a maximum voltage in specification (a rated voltage).

Applying a voltage exceeding a maximum voltage in specification causes impact ionization somewhere in the structure of a vertical field-effect transistor. This applied voltage is a breakdown voltage of the vertical field-effect transistor. The vertical field-effect transistor has to be designed so that the breakdown voltage is higher than the maximum voltage in specification.

For vertical field-effect transistors including a gate trench, a tip of the gate trench is a portion in which impact ionization is likely to occur in response to a voltage application. A variation in breakdown voltage of the vertical field-effect transistors is also generated due to the manufacturing workmanship of the gate trench.

Patent Literature (PTL) 1 discloses the structure of a vertical field-effect transistor and shows an example of an end structure of a body region.

Solution to Problem

In order to solve the above problem, a semiconductor device according to the present disclosure is a semiconductor device that is a facedown mountable, chip-size-package type semiconductor device, the semiconductor device comprising: a vertical field-effect transistor including: a semiconductor substrate of a first conductivity type that contains an impurity of the first conductivity type; a low-concentration impurity layer of the first conductivity type that is disposed on the semiconductor substrate and contains an impurity of the first conductivity type having a concentration lower than a concentration of the impurity of the first conductivity type contained in the semiconductor substrate; a body region of a second conductivity type that is disposed in the low-concentration impurity layer, the second conductivity type being different from the first conductivity type; a source region of the first conductivity type that is disposed in the body region; a gate trench that penetrates through the body region from a top surface of the low-concentration impurity layer to a depth that reaches a portion of the low-concentration impurity layer, and extends in a first direction parallel to the top surface of the low-concentration impurity layer; a gate insulating film that is disposed inside the gate trench; and a gate conductor that is disposed on the gate insulating film inside the gate trench, wherein a direction orthogonal to the first direction along the top surface of the low-concentration impurity layer is defined as a second direction, and a direction orthogonal to both the first direction and the second direction is defined as a third direction, the body region includes: a first body portion that contains an active region in which a conducting channel is provided in a plan view of the low-concentration impurity layer, and has a constant depth from the top surface of the low-concentration impurity layer; and a second body portion that is adjacent to the first body portion on a side of an outer peripheral region surrounding the active region in the plan view, and includes a zone that has a limited length in the second direction and a constant depth from the top surface of the low-concentration impurity layer at a position shallower than the constant depth of the first body portion, and the second body portion includes a portion in which a region having a relatively high concentration of an impurity of the second conductivity type and a region having a relatively low concentration of an impurity of the second conductivity type are alternately and periodically present in the first direction in a cross-sectional view of a plane including the first direction and the third direction.

In the semiconductor device according to the present disclosure, the second body portion may include a portion in which a shallow region and a deep region are alternately and periodically present in the first direction in the cross-sectional view of the plane including the first direction and the third direction.

In the semiconductor device according to the present disclosure, in a cross-sectional view of a plane including the second direction and the third direction, a depth of the first body portion is denoted by D1 [μm], a depth of the second body portion in a zone closest to the first body portion, among zones in each of which the depth of the second body portion is constant, is denoted by D2 [μm], a point that is on a bottom surface of the body region at which the depth D1 of the first body portion ends, and connects to a bottom surface of the second body portion is defined as a first connection point, and a point on the bottom surface of the second body portion farthest from the first body portion, at which the depth D2 ends, is defined as a second connection point, in the cross-sectional view of the plane including the second direction and the third direction, the depth of the second body portion monotonically decreases in the second direction, the second body portion includes: a first zone where the bottom surface of the second body portion changes from the first connection point to the depth D2; and a second zone where the bottom surface of the second body portion changes from the second connection point to a point at which the body region ends on the top surface of the low-concentration impurity layer, and D2>D1×L2/L1 may be satisfied, where a length from the first connection point to a point at which the body region ends on the top surface of the low-concentration impurity layer in the second direction is denoted by L1 [μm], and a length from the second connection point to the point at which the body region ends on the top surface of the low-concentration impurity layer in the second direction is denoted by L2 [μm].

In the semiconductor device according to the present disclosure, when, in the cross-sectional view of the plane including the first direction and the third direction, a depth of a shallow region of the second body portion is denoted by d21 [μm], a depth of a deep region of the second body portion is denoted by d22 [μm], and a pitch is denoted by a [μm], the shallow region and the deep region being alternately and periodically present in the first direction, a closest zone in which the depth of the second body portion is represented by d22−(d22−d21)/4 in the first direction may be substantially equal to a×D2/D1.

According to the above-described configurations, when a voltage higher than or equal to a maximum voltage in specification is applied between the drain and the source of the vertical field-effect transistor, it is possible to avoid a variation in breakdown voltage due to the workmanship of the gate trench, and at the same time to set a sufficient margin for the maximum voltage in specification. Moreover, since it is possible to relatively easily and freely control a terminus structure of the body region with a single impurity injection, it is possible to achieve an effect of reducing the manufacturing cost of the semiconductor device.

A semiconductor device according to the present disclosure is a semiconductor device that is a facedown mountable, chip-size-package type semiconductor device, the semiconductor device comprising: a vertical field-effect transistor including: a semiconductor substrate of a first conductivity type that contains an impurity of the first conductivity type; a low-concentration impurity layer of the first conductivity type that is disposed on the semiconductor substrate and contains an impurity of the first conductivity type having a concentration lower than a concentration of the impurity of the first conductivity type contained in the semiconductor substrate; a body region of a second conductivity type that is disposed in the low-concentration impurity layer, the second conductivity type being different from the first conductivity type; a source region of the first conductivity type that is disposed in the body region; a source electrode that is electrically connected to the body region and the source region; a gate trench that penetrates through the body region from a top surface of the low-concentration impurity layer to a depth that reaches a portion of the low-concentration impurity layer, and extends in a first direction parallel to the top surface of the low-concentration impurity layer; a gate insulating film that is disposed inside the gate trench; and a gate conductor that is disposed on the gate insulating film inside the gate trench, wherein a direction orthogonal to the first direction along the top surface of the low-concentration impurity layer is defined as a second direction, and a direction orthogonal to both the first direction and the second direction is defined as a third direction, the body region includes: a first body portion that contains an active region in which a conducting channel is provided in a plan view of the low-concentration impurity layer, and has a constant depth of D1 [μm] from the top surface of the low-concentration impurity layer; and a second body portion that is adjacent to the first body portion on a side of an outer peripheral region surrounding the active region in the plan view, and includes a zone that has a limited length in the second direction and a constant depth of D2 [μm] from the top surface of the low-concentration impurity layer at a position shallower than the constant depth of the first body portion, D2<Ds<D1 is satisfied, where a depth from the top surface of the low-concentration impurity layer to a bottom surface of the source region is denoted by Ds [μm], and a concentration profile of an impurity of the second conductivity type contained in the first body portion in the third direction may match a concentration profile of an impurity of the second conductivity type contained in the second body portion in the third direction, in a zone from the top surface of the low-concentration impurity layer to the depth of D2, when a concentration of an impurity of the second conductivity type is higher than or equal to 1E19 cm$^{-3}$.

In the semiconductor device according to the present disclosure, in a cross-sectional view of a plane including the second direction and the third direction, an oxide film in direct contact with the low-concentration impurity layer may be disposed closer to a side of an outer peripheral region of the semiconductor device than to a border between the first body portion and the second body portion in the second direction.

In the semiconductor device according to the present disclosure, in the cross-sectional view of the plane including the second direction and the third direction, a zone in which the depth of the second body portion is constant at the depth of D2 is a zone closest to the first body portion among zones in each of which the depth of the second body portion is constant, a point that is on a bottom surface of the body region at which the depth of D1 of the first body portion ends, and connects to a bottom surface of the second body portion is a first connection point, a point on the bottom surface of the second body portion farthest from the first body portion, at which the depth of D2 ends, is a second connection point, in the cross-sectional view of the plane including the second direction and the third direction, the depth of the second body portion monotonically decreases in the second direction, the second body portion includes: a first zone where the bottom surface of the second body portion changes from the first connection point to the depth of D2; and a second zone where the bottom surface of the second body portion changes from the second connection point to a point at which the body region ends on the top surface of the low-concentration impurity layer, and in the cross-sectional view of the plane including the second direction and the third direction, the second zone of the second body portion may be directly below the oxide film.

In the semiconductor device according to the present disclosure, a drain-source maximum voltage in specification BVDSS [V] of the semiconductor device may satisfy BVDSS≤26.4×(L1)$^2$−36.4×L1+31.5, where a length from the first connection point to the point at which the body region ends on the top surface of the low-concentration impurity layer in the second direction is denoted by L1 [μm].

According to the above-described configurations, when a voltage higher than or equal to a maximum voltage in specification is applied between the drain and the source of the vertical field-effect transistor while a contact resistance between the body region and source electrode is reduced, it is possible to avoid a variation in breakdown voltage due to the workmanship of the gate trench, and at the same time to set a sufficient margin for the maximum voltage in specification.

In the semiconductor device according to the present disclosure, in a cross-sectional view of a plane including the second direction and the third direction, a gate wiring structure having a same electric potential as the gate conductor may only be disposed closer to the side of the outer peripheral region of the semiconductor device than to the second body portion in the second direction.

According to the above-described configuration, since it is possible to make a terminus portion of the body region less susceptible to the influence of an electric field from the gate wiring, it is possible to achieve an effect of stabilizing a breakdown voltage of the vertical field-effect transistor within a desired range.

In the semiconductor device according to the present disclosure, a top surface of the gate conductor inside the gate trench is above an interface between the source region and the body region in the third direction, and a sum of a length from the top surface of the gate conductor to the interface between the source region and the body region and a length from an interface between the body region and the low-concentration impurity layer to a tip of the gate trench may be constant in a plane of the semiconductor device.

According to the above-described configuration, since it is possible to reduce a manufacturing variation in threshold voltage Vth [V] of the vertical field-effect transistor, it is possible to increase a manufacturing yield due to the variation in Vth.

Advantageous Effects of Invention

The present disclosure has an object to provide a semiconductor device that is capable of stabilizing a breakdown voltage of a vertical field-effect transistor, and at the same time sets a sufficient margin for a maximum voltage in specification.

BRIEF DESCRIPTION OF DRAWINGS

FIG. 4 is a schematic plan view showing an example of the structure of the semiconductor device according to Embodiment 1.

FIG. 5C is a schematic cross-sectional view obtained by superimposing simulation results of impact ionization on the structure in the outer periphery of the semiconductor device shown in FIG. 5A.

FIG. 11B is a schematic cross-sectional view obtained by enlarging a portion of FIG. 11A.

FIG. 11D is a schematic cross-sectional view showing an example of the structure in the outer periphery of the semiconductor device according to Embodiment 2.

FIG. 15A1 is a schematic cross-sectional view showing a manufacturing process of the semiconductor device according to the comparative example.

FIG. 15A2 is a schematic cross-sectional view showing a manufacturing process of the semiconductor device according to the comparative example.

FIG. 15A3 is a schematic cross-sectional view showing a manufacturing process of the semiconductor device according to the comparative example.

FIG. 15A4 is a schematic cross-sectional view showing a manufacturing process of the semiconductor device according to the comparative example.

FIG. 15A5 is a schematic cross-sectional view showing a manufacturing process of the semiconductor device according to the comparative example.

FIG. 15A6 is a schematic cross-sectional view showing a manufacturing process of the semiconductor device according to the comparative example.

FIG. 15B1 is a schematic cross-sectional view showing a manufacturing process of the semiconductor device according to Embodiment 2.

FIG. 15B2 is a schematic cross-sectional view showing a manufacturing process of the semiconductor device according to Embodiment 2.

FIG. 15B3 is a schematic cross-sectional view showing a manufacturing process of the semiconductor device according to Embodiment 2.

FIG. 15B4 is a schematic cross-sectional view showing a manufacturing process of the semiconductor device according to Embodiment 2.

FIG. 15B5 is a schematic cross-sectional view showing a manufacturing process of the semiconductor device according to Embodiment 2.

DESCRIPTION OF EMBODIMENTS

1. Structure of Semiconductor Device

Hereinafter, matters common to the embodiments of the present disclosure to be described below are described prior to the embodiments.

A vertical field-effect transistor according to the present disclosure is described with a dual configuration as an example. A vertical field-effect transistor need not include a dual configuration, and may include a single configuration or at least a triple configuration.

Figure 1:
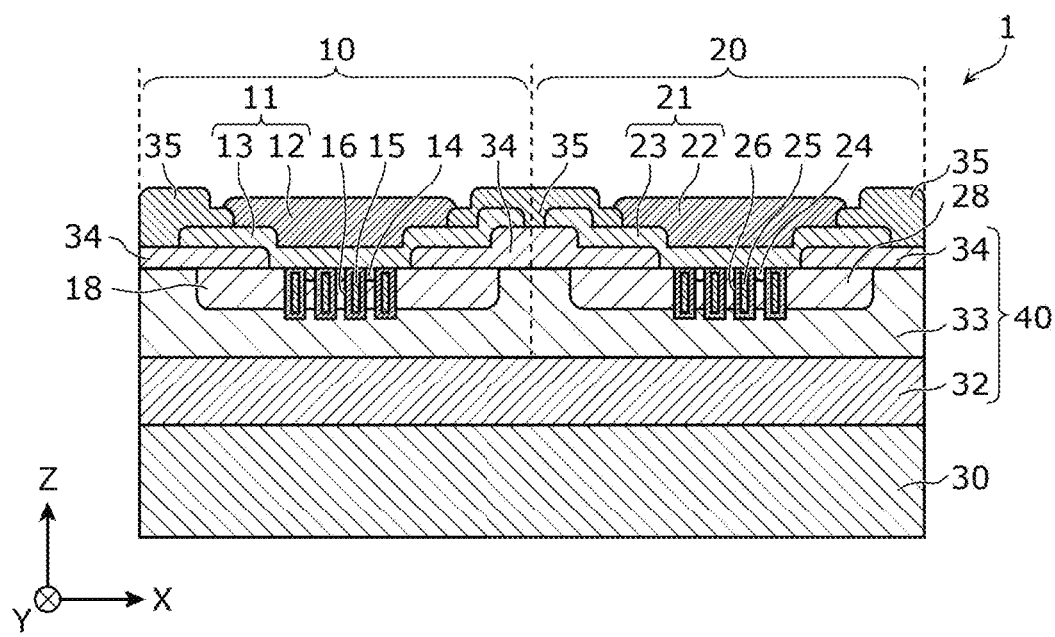
FIG. 1 is a schematic cross-sectional view showing an example of a structure of a semiconductor device according to Embodiment 1.
Figure 2A:
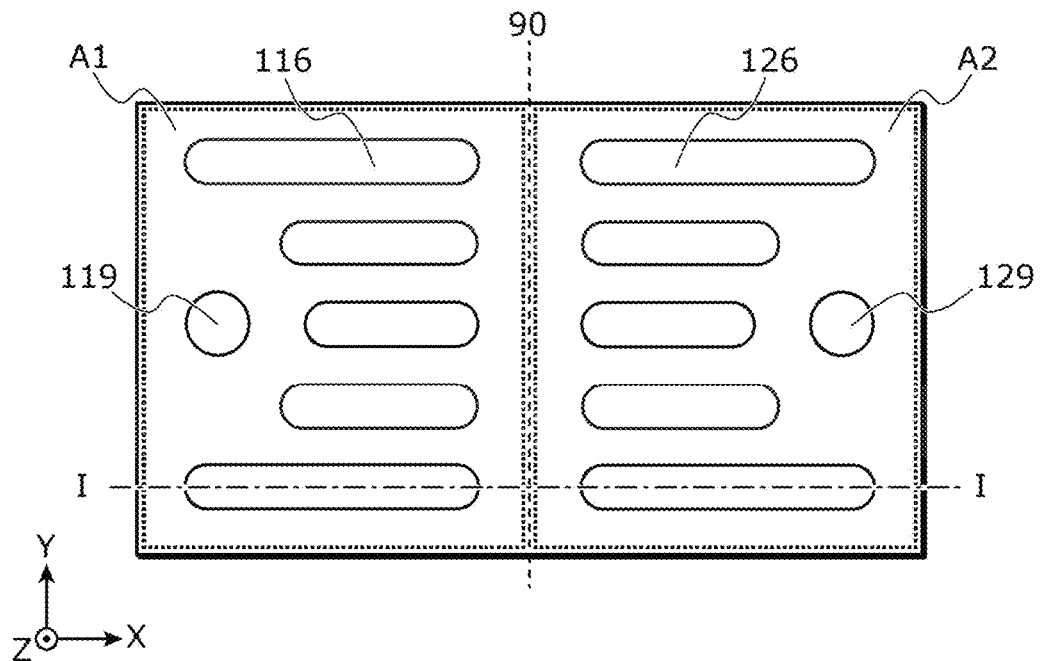
FIG. 2A is a schematic plan view showing the example of the structure of the semiconductor device according to Embodiment 1.
Figure 2B:
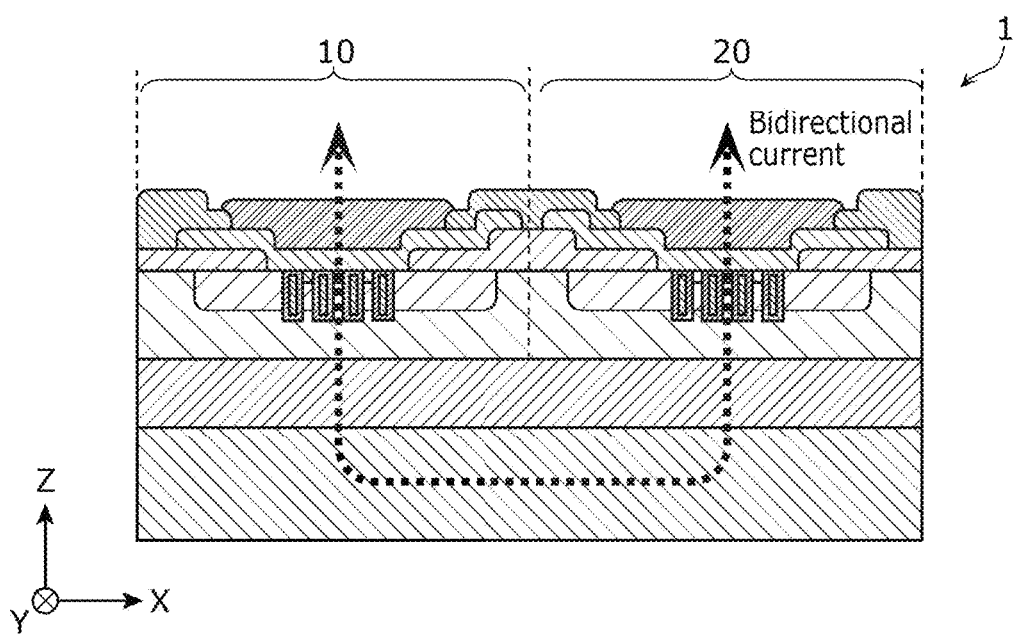
FIG. 2B is a schematic cross-sectional view showing a principal current flowing through the semiconductor device according to Embodiment 1.

FIG. 1 is a schematic cross-sectional view showing an example of a structure of a semiconductor device. FIG. 2A is a plan view of the structure. The size and shape of the semiconductor device and the arrangement of electrode pads are an example. FIG. 2B is a cross-sectional view schematically showing a principal current flowing through the semiconductor device. FIG. 1 and FIG. 2B show a cross section taken along line I-I in FIG. 2A.

As shown in FIG. 1 and FIG. 2A, semiconductor device 1 includes: semiconductor layer 40; metal layer 30; first vertical field-effect transistor 10 (hereinafter also referred to as "transistor 10") provided in first region A1 in semiconductor layer 40; and second vertical field-effect transistor 20 (hereinafter also referred to as "transistor 20") provided in second region A2 in semiconductor layer 40. Here, as shown in FIG. 2A, first region A1 and second region A2 are adjacent to each other in a plan view of semiconductor layer 40, and divide semiconductor device 1 into equal areas. In FIG. 2A, a dashed line indicates virtual boundary line 90 between first region A1 and second region A2.

Semiconductor layer 40 is provided by stacking semiconductor substrate 32 and low-concentration impurity layer 33. Semiconductor substrate 32 is disposed on a rear surface side of semiconductor layer 40, and includes silicon of a first conductivity type containing impurities of the first conductivity type. Low-concentration impurity layer 33 is disposed in contact with semiconductor substrate 32 on a front surface side of semiconductor layer 40, is of the first conductivity type, and contains impurities of the first conductivity type having a concentration lower than a concentration of the impurities of the first conductivity type contained in semiconductor substrate 32. Low-concentration impurity layer 33 may be provided on semiconductor substrate 32 by, for example, epitaxial growth. It should be noted that low-concentration impurity layer 33 is also a drift layer of transistors 10 and 20, and may be referred to as a drift layer in the Description.

Metal layer 30 is provided in contact with the rear surface side of semiconductor layer 40 and includes silver (Ag) or copper (Cu). It should be noted that metal layer 30 may include a trace amount of a chemical element other than metal mixed in as impurities in a step of manufacturing a metal material. Moreover, metal layer 30 may be or may not be provided on the entirety of the rear surface of semiconductor layer 40.

As shown in FIG. 1 and FIG. 2A, first body region 18 containing impurities of a second conductivity type different from the first conductivity type is provided in first region A1 of low-concentration impurity layer 33. First source region 14 containing impurities of the first conductivity type, first gate conductor 15, and first gate insulating film 16 are provided in first body region 18.

First gate insulating film 16 is provided inside each of a plurality of first gate trenches 17 that penetrate through first body region 18 from a top surface of semiconductor layer 40 to a depth that reaches a portion of low-concentration impurity layer 33. First gate conductor 15 is provided on first gate insulating film 16.

First source electrode 11 includes portion 12 and portion 13. Portion 12 is connected to first source region 14 and first body region 18 via portion 13. First gate conductor 15 is an embedded gate electrode embedded inside semiconductor layer 40, and is electrically connected to first gate electrode pad 119.

Portion 12 of first source electrode 11 may be a layer joined with solder at the time of reflow in facedown mounting, and comprise, as a non-limiting example, a metal material including at least one of nickel, titanium, tungsten, or palladium. The surface of portion 12 may be plated with gold etc.

Portion 13 of first source electrode 11 may be a layer that connects portion 12 and semiconductor layer 40, and comprise, as a non-limiting example, a metal material including at least one of aluminum, copper, gold, or silver.

Second body region 28 containing impurities of the second conductivity type is provided in second region A2 of low-concentration impurity layer 33. Second source region 24 containing impurities of the first conductivity type, second gate conductor 25, and second gate insulating film 26 are provided in second body region 28.

Second gate insulating film 26 is provided inside each of a plurality of second gate trenches 27 that penetrate through second body region 28 from the top surface of semiconductor layer 40 to a depth that reaches a portion of low-concentration impurity layer 33. Second gate conductor 25 is provided on second gate insulating film 26.

Second source electrode 21 includes portion 22 and portion 23. Portion 22 is connected to second source region 24 and second body region 28 via portion 23. Second gate conductor 25 is an embedded gate electrode embedded inside semiconductor layer 40, and is electrically connected to second gate electrode pad 129.

Portion 22 of second source electrode 21 may be a layer joined with solder at the time of reflow in facedown mounting, and comprise, as a non-limiting example, a metal material including at least one of nickel, titanium, tungsten, or palladium. The surface of portion 22 may be plated with gold etc.

Portion 23 of second source electrode 21 may be a layer that connects portion 22 and semiconductor layer 40, and comprise, as a non-limiting example, a metal material including at least one of aluminum, copper, gold, or silver.

The above-described configuration of transistors 10 and 20 allow semiconductor substrate 32 to serve as a common drain region having a first drain region of transistor 10 and a second drain region of transistor 20 in common. A portion of low-concentration impurity layer 33 on a side adjacent to semiconductor substrate 32 may sometimes serve as a common drain region. In addition, metal layer 30 serves as a common drain electrode having a drain electrode of transistor 10 and a drain electrode of transistor 20 in common.

As shown in FIG. 1, first body region 18 is covered with interlayer insulating layer 34 having an opening, and portion 13 of first source electrode 11 connected to first source region 14 is provided via the opening of interlayer insulating layer 34. Interlayer insulating layer 34 and portion 13 of first source electrode 11 are covered with passivation layer 35 having an opening, and portion 12 connected to portion 13 of first source electrode 11 is provided via the opening of passivation layer 35.

Second body region 28 is covered with interlayer insulating layer 34 having an opening, and portion 23 of second source electrode 21 connected to second source region 24 is provided via the opening of interlayer insulating layer 34. Interlayer insulating layer 34 and portion 23 of second source electrode 21 are covered with passivation layer 35 having an opening, and portion 22 connected to portion 23 of second source electrode 21 is provided via the opening of passivation layer 35.

Accordingly, a plurality of first source electrode pads 116 refer to a region in which first source electrode 11 is partially exposed to the surface of semiconductor device 1, that is, a terminal portion; and a plurality of second source electrode pads 126 refer to a region in which second source electrode 21 is partially exposed to the surface of semiconductor device 1, that is, a terminal portion. Similarly, one or more first gate electrode pads 119 refer to a region in which first gate electrode 19 (not shown in FIG. 1, FIG. 2A, FIG. 2B) is partially exposed to the surface of semiconductor device 1, that is, a terminal portion; and one or more second gate electrode pads 129 refer to a region in which second gate electrode 29 (not shown in FIG. 1, FIG. 2A, FIG. 2B) is partially exposed to the surface of semiconductor device 1, that is, a terminal portion.

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18 and second body region 28 may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18 and second body region 28 may be N-type semiconductors.

The following description illustrates a conductive operation of semiconductor device 1 when, assuming that the first conductivity type is N-type and the second conductivity is P-type, transistors 10 and 20 are what is called N-channel transistors.

It should be noted that the following description is on the premise that transistors 10 and 20 have symmetry, that is, are the same in function, characteristics, structure, etc. Although FIG. 1, FIG. 2A, and FIG. 2B are drawn on the premise of symmetry, symmetry is not always a necessary condition for a chip-size-package type vertical field-effect transistor including a dual configuration in the present disclosure.

It may be recognized that a vertical field-effect transistor including a single configuration is generally formed of only one side (transistor 10) of a vertical field-effect transistor including a dual configuration. For the chip-size-package type, however, it is necessary to further provide a drain electrode pad on the front surface side of semiconductor layer 40 including source electrode pad 116 and gate electrode pad 119. In this case, it is necessary to form, from the front surface side of semiconductor layer 40, a drain extraction structure electrically connected to a drain layer on a rear surface side of semiconductor layer 40.

2. Operation of Vertical Field-Effect Transistor

Figure 3A:
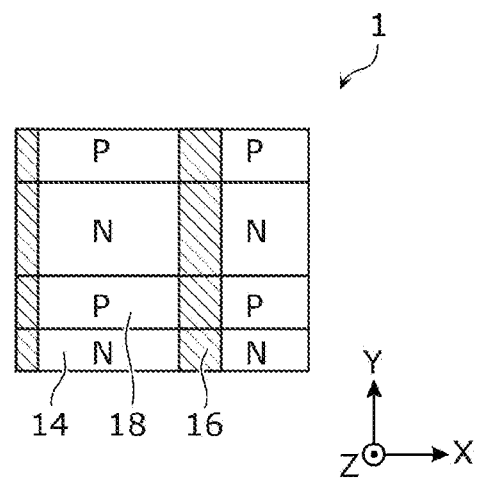
FIG. 3A is a schematic plan view of an approximate single unit configuration of a first transistor according to Embodiment 1.
Figure 3B:
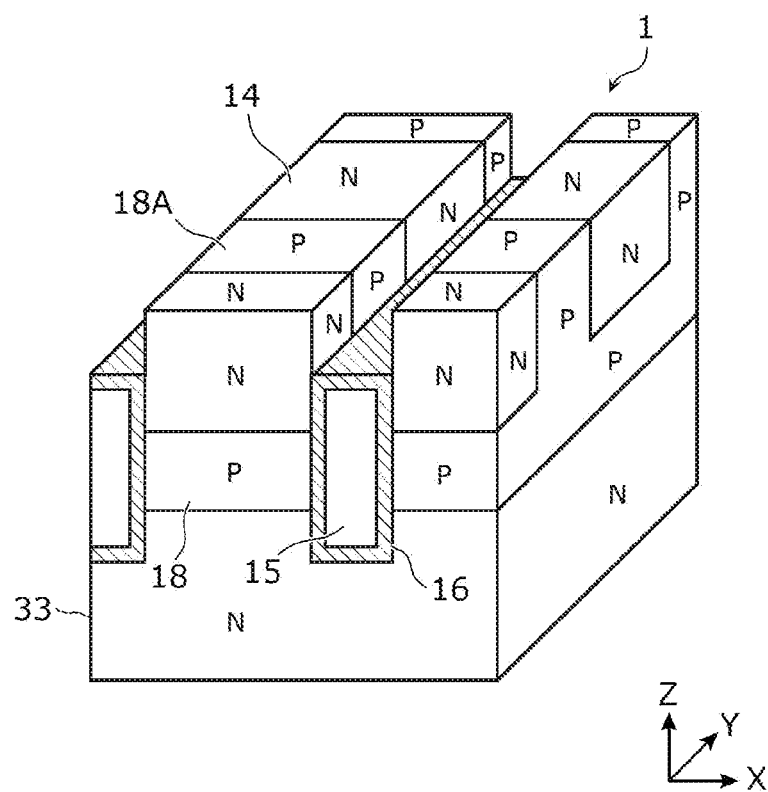
FIG. 3B is a schematic perspective view of the approximate single unit configuration of the first transistor according to Embodiment 1.

FIG. 3A and FIG. 3B are a plan view and a perspective view of an approximate single unit configuration of transistor 10 (or transistor 20) that is repeatedly formed in a X direction and a Y direction of semiconductor device 1, respectively. For the sake of clarity, neither FIG. 3A nor FIG. 3B illustrates semiconductor substrate 32, first source electrode 11 (or second source electrode 21), passivation layer 35, and interlayer insulating layer 34.

The Y direction is a direction that is parallel to the top surface of semiconductor layer 40 (low-concentration impurity layer 33) and in which first gate trench 17 and second gate trench 27 extend. The X direction is a direction that is parallel to the top surface of semiconductor layer 40 (low-concentration impurity layer 33) and orthogonal to the Y direction. A Z direction is a direction that is orthogonal to both the X direction and the Y direction and indicates a height direction of semiconductor device 1. In the present disclosure, the Y direction, the X direction, and the Z direction may be referred to as a first direction, a second direction, and a third direction, respectively.

As shown in FIG. 3A and FIG. 3B, transistor 10 includes first connector 18A that electrically connects first body region 18 and first source electrode 11. First connector 18A is a region of first body region 18 in which first source region 14 is not provided, and contains the same impurities of the second conductivity type as those of first body region 18. First source region 14 and first connector 18A are alternately and periodically disposed in the Y direction. The same applies to transistor 20.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a principal current flows in a pathway from first source electrode 11 to first connector 18A to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 to second source electrode 21, and semiconductor device 1 becomes conductive. It should be noted that a PN junction (also referred to as a main junction) is in an interface between second body region 28 and low-concentration impurity layer 33 in this conductive pathway and serves as a body diode. Moreover, since this principal current flows through metal layer 30, increasing the thickness of metal layer 30 makes it possible to increase the cross-sectional area of the principal current pathway and reduce an on-resistance of semiconductor device 1.

In semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a principal current flows in a pathway from second source electrode 21 to second connector 28A to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 to first source electrode 11, and semiconductor device 1 becomes conductive. It should be noted that a PN junction (also referred to as a main junction) is in an interface between first body region 18 and low-concentration impurity layer 33 in this conductive pathway and serves as a body diode.

3. Active Region and Outer Peripheral Region (End Portion)

FIG. 4 is a plan view showing an example of shapes of, among the constituent elements of semiconductor device 1, first body region 18, second body region 28, first active region 112, and second active region 122 in a plan view of semiconductor layer 40 (low-concentration impurity layer 33). Though not shown in FIG. 4, both first gate trench 17 and second gate trench 27 extend in the Y direction.

First active region 112 refers to a minimum area that contains an entire portion in which a conducting channel is formed when a voltage higher than or equal to a threshold value is applied to first gate electrode 19 (first gate conductor 15) of transistor 10. The portion in which the conducting channel is formed is a portion in which each of the plurality of first gate trenches 17 is adjacent to first source region 14. First active region 112 is contained by first body region 18 in the plan view of semiconductor layer 40.

Second active region 122 refers to a minimum area that contains an entire portion in which a conducting channel is formed when a voltage higher than or equal to a threshold value is applied to second gate electrode 29 (second gate conductor 25) of transistor 20. The portion in which the conducting channel is formed is a portion in which each of the plurality of second gate trenches 27 is adjacent to second source region 24. Second active region 122 is contained by second body region 28 in the plan view of semiconductor layer 40.

A region surrounding first active region 112 of first region A1 is referred to as a first outer peripheral region, and a region surrounding second active region 122 of second region A2 is referred to as a second outer peripheral region.

In the present disclosure, first body region 18 gradually becomes shallower and ends in both the X direction and the Y direction in the first outer peripheral region of semiconductor device 1. Moreover, second body region 28 gradually becomes shallower and ends in both the X direction and the Y direction in the second outer peripheral region of semiconductor device 1.

Although the following describes, for each embodiment, characteristics and effects of a shape in which a body region ends, a method of identifying a bottom surface of first body region 18 or second body region 28, that is, main junction 18b is first described. It should be noted that a bottom surface of a body region is synonymous with a main junction in the present disclosure.

An example of the method of identifying main junction 18b is a method including: cutting semiconductor device 1 to expose an XZ plane or a YZ plane; performing a staining process on a certain area in a cross section including a first outer peripheral region or a second outer peripheral region; and observing the certain area with a scanning electron microscope (SEM). The staining process refers to a method of etching with a chemical solution in which nitric acid, hydrofluoric acid, and acetic acid are mixed at a certain rate. This method blackens the tone of a semiconductor region containing P-type impurities and makes it possible to clarify an interface between a body region and a drift layer.

Another example of the method of identifying main junction 18b is a method including: cutting semiconductor device 1 to expose an XZ plane or a YZ plane; and measuring a certain area in a cross section including a first outer peripheral region or a second outer peripheral region using scanning capacitance microscopy (SCM).

The SCM has difficulty measuring an impurity concentration of a semiconductor on an observed surface but can measure a conductivity type with high accuracy. For this reason, it is possible to map a conductivity type of the semiconductor on a cross section. In the SCM, normally, a difference between the N type and the P type is represented by a change in capacitance depending on a carrier concentration, and numerical data in which an absolute value indicates a signal intensity of a polarity is obtained from each measured unit portion.

Since the position of main junction 18b is neither the N type nor the P type in principle, a position at which numerical data is 0 or approximate to 0 is to be tracked. Accordingly, when positions in the X direction and signal intensities of polarities are plotted on the horizontal axis and the vertical axis, respectively, it is safe to consider a point at which the vertical axis indicates 0 as the position of main junction 18b.

Although the present disclosure may indicate main junction 18b as being flat, this indication does not necessary mean that strict flatness is specified. The present disclosure includes a case in which main junction 18b is recognized as being approximately flat based on a positional average of profiles obtained by the SCM or images obtained by the SEM.

It should be noted that in the following description of each embodiment, that semiconductor device 1 includes a dual configuration is not regarded as important, and, unless otherwise noted, the respective constituent elements are described without distinguishing them by first and second. Assigned numbers assigned to the first constituent elements are used as representatives.

Embodiment 1

[1-1. Shape of End Structure of Body Region]

Figure 5A:
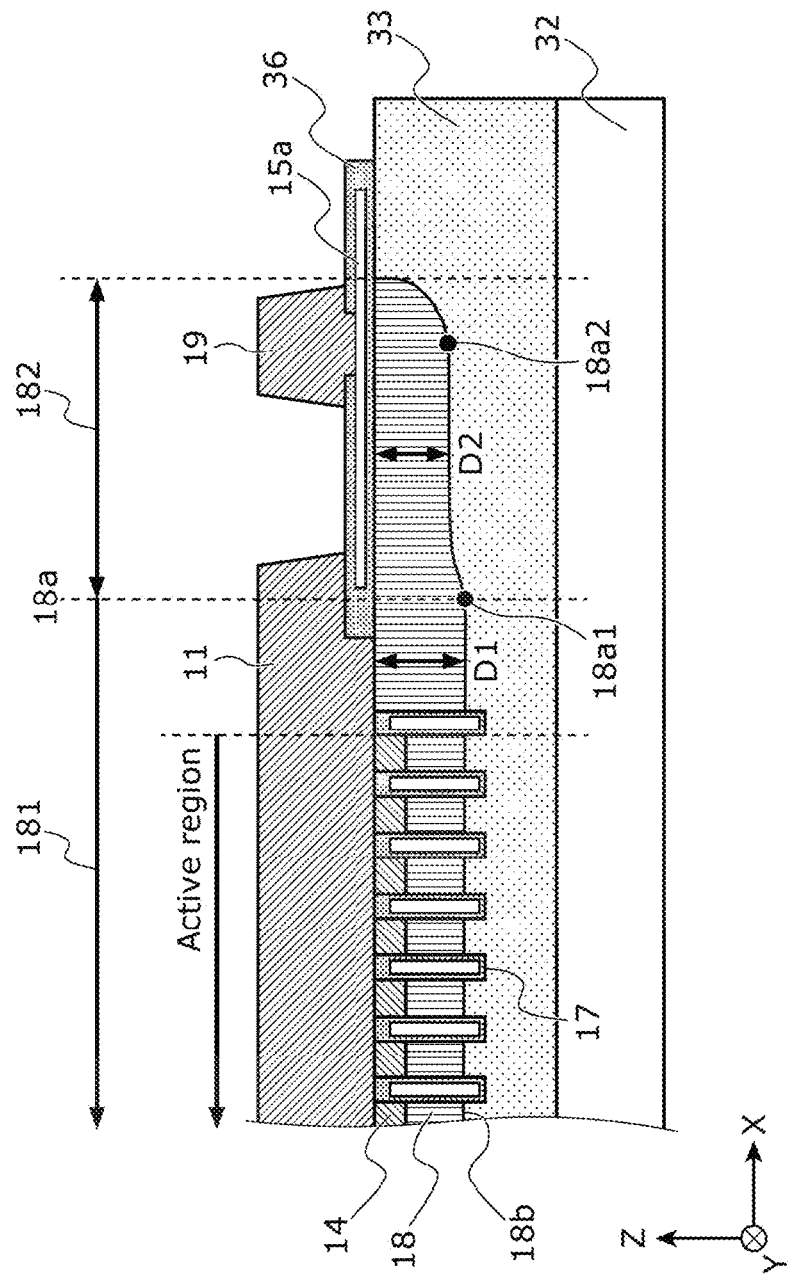
FIG. 5A is a schematic cross-sectional view showing an example of a structure in the outer periphery of the semiconductor device according to Embodiment 1.
Figure 5B:
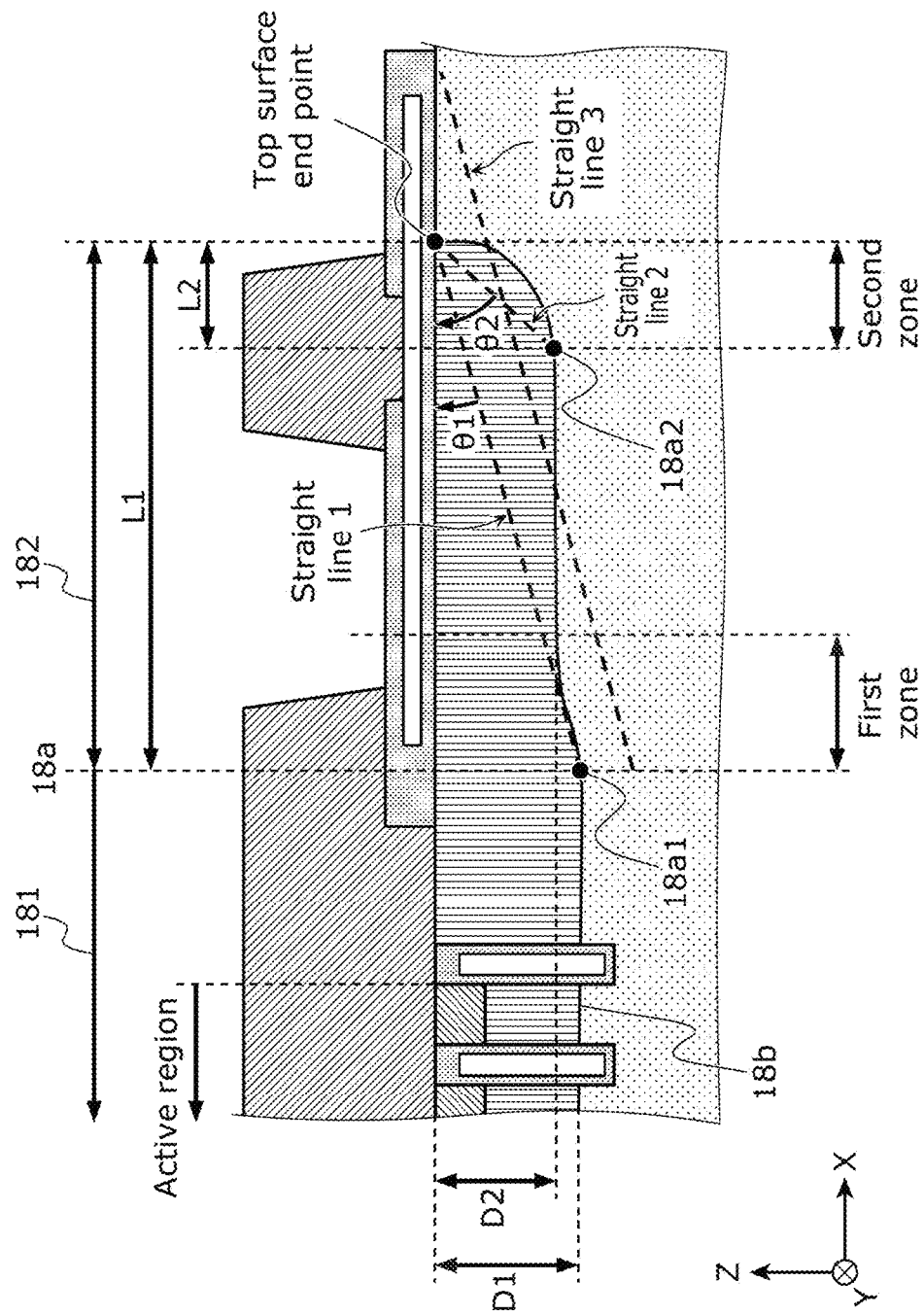
FIG. 5B is a schematic cross-sectional view obtained by enlarging a portion of FIG. 5A.

FIG. 5A schematically shows a portion of a structure (hereinafter may be referred to as an end structure or a terminus structure) of an outer peripheral region of semiconductor device 1 according to Embodiment 1 in the X direction. In addition, FIG. 5B is a portion of FIG. 5A and is obtained by enlarging a portion of the end structure of body region 18.

It should be noted that illustration of passivation layer 35 and metal layer 30 is omitted from FIG. 5A, FIG. 5B, and FIG. 5C to be described later.

For dual-type semiconductor device 1, since the first outer peripheral region and the second outer peripheral region surround first active region 112 and second active region 122, respectively, in a plan view, a central side of semiconductor device 1 (the vicinity of border line 90 between transistor 10 and transistor 20) also has a similar structure. It is safe to consider the schematic cross-sectional view shown in FIG. 5A as being common to cross sections viewed from arrow sides in the respective dashed frames shown in FIG. 4.

As shown in FIG. 5A, body region 18 includes: first body portion 181 that contains active region 112 in which a conducting channel is provided, and has a constant depth from a top surface of low-concentration impurity layer 33; and second body portion 182 that does not include active region 112, is adjacent to first body portion 181 on a side of an outer peripheral region surrounding active region 112 in the plan view of low-concentration impurity layer 33, and has a zone that has a limited length in the X direction and a constant depth from the top surface of low-concentration impurity layer 33 at a position shallower than the depth of first body portion 181.

In a cross-sectional view of a plane (XZ plane) including the X direction and the Z direction, when the depth of first body portion 181 (a length from a top surface to a bottom surface of first body portion 181, that is, a length to main junction 18b in the Z direction) is denoted by D1 [μm], and a depth (a length from a top surface to a bottom surface of second body portion 182, that is, a length to main junction 18b in the Z direction) of a zone closest to first body portion 181, among zones in which the depth of second body portion 182, is constant is denoted by D2 [μm], D1>D2 is satisfied. It should be noted that since the number of zones of second body portion 182 in which a depth is constant is one in FIG. 5A or FIG. 5B, the depth of this zone is D2.

In the same cross-sectional view, first body portion 181 is a portion of body region 18 that shows a flat shape at depth D1 on a side in which bottom surface 18b of body region 18 includes active region 112. Second body portion 182 ranges from a point at which bottom surface 18b of body region 18 starts to rise in a +Z direction on the outer peripheral region side to a point at which bottom surface 18b ends on the top surface of low-concentration impurity layer 33 on the side of the outer peripheral region.

In the same cross-sectional view, when a point that is on bottom surface 18b of body region 18 at which depth D1 of first body portion 181 ends, and connects to the bottom surface of second body portion 182 is defined as first connection point 18a1, border 18a between first body portion 181 and second body portion 182 is a straight line passing through first connection point 18a1 in the Z direction.

Moreover, in the same cross-sectional view, second body portion 182 includes a first zone where bottom surface 18b of body region 18 changes from first connection point 18a1 to depth D2, and which has a limited length in the X direction. First connection point 18a1 may be considered as being included in first body portion 181, or may be considered as being included in the first zone of second body portion 182. In addition, a zone in which a depth is evenly kept at D2 in second body portion 182 may be considered as being included in the first zone.

In the same cross-sectional view, when a potion that is on the bottom surface of second body portion 182 at which depth D2 ends farthest from first body portion 181 in the X direction is defined as second connection point 18a2, second body portion 182 includes a second zone that (i) ranges from second connection point 18a2 to a point at which body region 18 ends on the top surface of low-concentration impurity layer 33, and (ii) has a limited length in the X direction. The second zone includes second connection point 18a2.

In the same cross-sectional view, when a zone of second body portion 182 in which a depth is evenly kept at D2 is considered as being included in the first zone, second connection point 18a2 is a point that is on bottom surface 18b of body region 18 and connects the first zone and the second zone of second body portion 182.

In the same cross-sectional view, when the bottom surface of second body portion 182 is geometrically considered, second connection point 18a2 can be referred to as an inflection point that has the same direction as the inflection of first connection point 18a1 and is closest to first connection point 18a1.

In the same cross-sectional view, bottom surface 18b of body region 18 in the first zone does not include a portion in which a depth is greater than D1 until the depth changes from D1 to D2. Moreover, in the same cross-sectional view, bottom surface 18b of body region 18 in the second zone does not include a portion in which a depth is greater than D2 until the depth changes from D2 to zero (the top surface of low-concentration impurity layer 33). In other words, the depth of second body portion 182 decreases monotonically in the X direction in the same cross-sectional view.

In the same cross-sectional view, a length of second body portion 182 in the X direction is denoted by L1 [μm]. L1 is a length in the X direction from first connection point 18a1 to a point at which second body portion 182 ends on the top surface of low-concentration impurity layer 33.

In the same cross-sectional view, a length of the second zone in second body portion 182 in the X direction is denoted by L2 [μm]. L2 is a length in the X direction from second connection point 18a2 to the point at which second body portion 182 ends on the top surface of low-concentration impurity layer 33.

Furthermore, in the same cross-sectional view, a semiconductor region indicating the second conductivity type is not disposed closer to a side of an outer peripheral region of semiconductor device 1 than to second body portion 182.

As will be described later, a magnitude relation between D1 and D2 and the lengths of L1 and L2 are elements for determining a curvature of a main junction (also referred to as a main junction end) in the outer peripheral region of semiconductor device 1. An expansion of a depletion layer is affected according to the curvature of the main junction end, and the likelihood of impact ionization is determined.

[1-2. Effects Achieved by Providing End Structure in Body Region]

FIG. 5C shows an impact ionization image in a simulation when a rated voltage in product specification (here, 22 V) is applied between the drain and the source, using the structure shown in FIG. 5A. In FIG. 5C, a difference in impact ionization rate is shown in color shading and is partially superimposed on FIG. 5A. It is clear from the figure that an electric field strength is greatest along main junction 18b (bottom surface 18b of body region 18), and a portion in which impact ionization is likely to occur is in the second zone of second body portion 182.

Since second body portion 182 includes a shallow portion (D1>D2), an expansion of a depletion layer containing main junction 18b in between is limited as indicated by white lines in FIG. 5C.

Moreover, in the second zone from second connection point 18a2 to the side of the outer peripheral region, an equipotential line density rises due to the influence of the shape of main junction 18b, and impact ionization becomes likely to occur as a result of an increase in the electric field strength. Accordingly, the second zone of second body portion 182 has a structure in which a breakdown voltage is lowest relative to the voltage application between the drain and the source.

Conditions advantageous to cause a breakdown voltage to be low in the second zone are described with reference to FIG. 5B.

As shown in FIG. 5B, in a cross-sectional view of the XZ plane, a straight line connecting first connection point 18a1 and the point at which body region 18 ends on the top surface of low-concentration impurity layer 33 (for the sake of simplicity, referred to as a top surface end point) is defined as straight line 1. When an angle formed by straight line 1 and the top surface of low-concentration impurity layer 33 is denoted by $\theta1$, $\tan \theta1 = D1/L1$.

When a voltage is applied between the drain and the source, the depletion layer expands upward and downward with main junction 18b in between. Attention being focused on a lower end of the depletion layer, the lower end of the depletion layer at first connection point 18a1 is present at a certain distance from main junction 18b in a −Z direction. A straight line that passes through the lower end of the depletion layer and is parallel to straight line 1 is defined as straight line 3.

It should be noted that the above-described certain distance is determined according to, for example, a concentration of the impurities of the second conductivity type contained in the vicinity of main junction 18b in first body portion 181 or a concentration of the impurities of the first conductivity type contained in low-concentration impurity layer 33.

Supposing that main junction 18b of second body portion 182 is in a shape that matches straight light 1, it is possible to approximate the depletion layer lower end by straight line 3. In this case, the depletion layer lower end in second body portion 182 is even and includes no portion in which an electric field strength increases in particular.

However, when main junction 18b of second body portion 182 is in a shape as shown in FIG. 5B, the expansion of the depletion layer in the second zone including second connection point 18a2 is restricted especially by second connection point 18a2 protruding downward (−Z direction) beyond straight line 1. As a result, since an electric field strength increases, it is possible to provide a portion having a low breakdown voltage in the second zone.

When an angle formed by straight line 2 connecting second connection point 18a2 and the top surface end point and the top surface of low-concentration impurity layer 33 is denoted by $\theta2$ ($\tan \theta2 = D2/L2$), $\theta2 > \theta1$ may be satisfied to cause second connection point 18a2 to protrude downward beyond straight line 1. Stated differently, with regard to depth D2 in second body portion 182, $D1 \times L2/L1 < D2 < D1$ may be satisfied.

Structurally, in first body portion 181 including active region 112, a breakdown voltage becomes low in the vicinity of a tip of gate trench 17. When impact ionization occurs in the vicinity of the tip of gate trench 17, a variation in breakdown voltage is generated due to the manufacturing workmanship of gate trench 17. For this reason, by purposely providing, in the outer peripheral region of semiconductor device 1, a structure in which impact ionization is likely to occur compared to the tip of gate trench 17, it is possible to reduce a variation in breakdown voltage.

Accordingly, when transistor 10 is purposely designed to cause a breakdown voltage in second body portion 182 to be lower than a breakdown voltage in first body portion 181, a breakdown voltage of transistor 10 may be stabilized.

In other words, maximum voltage in specification between drain and source (rated voltage) indicated in the production specification of transistor 10<breakdown voltage in second body portion 182<breakdown voltage in first body portion 181 may be satisfied.

Figure 6:
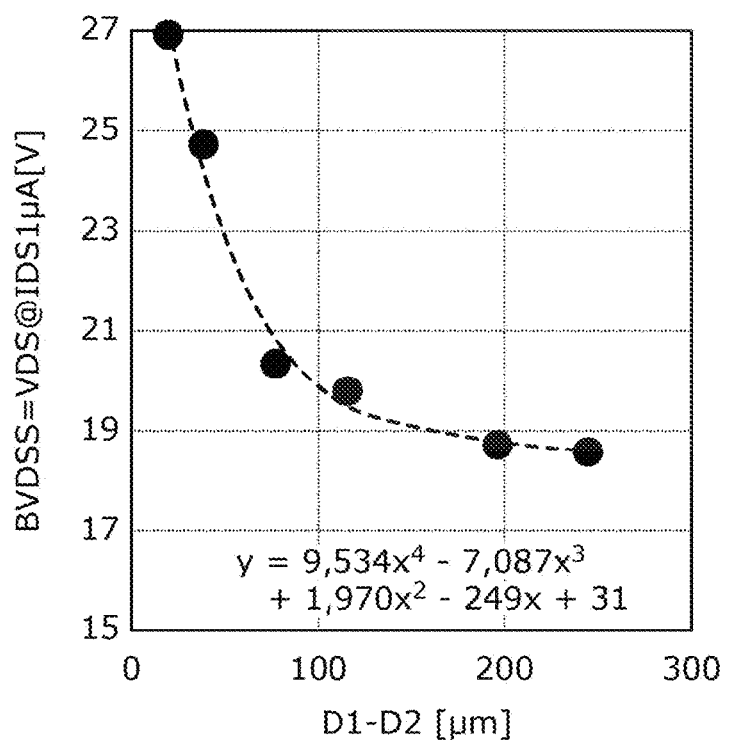
FIG. 6 is a graph showing a relation between (i) a breakdown voltage in a structure of each of a first body portion and a second body portion of the semiconductor device according to Embodiment 1 and (ii) a difference in depth between the first body portion and the second body portion, when the difference in depth between the first body portion and the second body portion is changed.

An example of a relation between a difference (D1−D2 [μm]) between depth D1 of first body portion 181 and depth D2 of second body portion 182 and breakdown voltage BVDSS [V] is plotted on FIG. 6. When a drain-source current is denoted by IDS [A], and a drain-source voltage is denoted by VDS [V], BVDSS [V] refers to VDS when IDS=1.0 HA and is defined as a breakdown voltage in a structure (BVDSS=VDS@IDS=1.0 μA). In FIG. 6, only a value of D2 is changed with a value of D1 being fixed together with other parameters such as L1 and L2.

According to FIG. 6, a breakdown voltage decreases with an increase in D1−D2, that is, as second connection point 18a2 becomes shallower, and the breakdown voltage eventually converges. The breakdown voltage in the second zone may be low from a viewpoint of stabilizing the breakdown voltage of transistor 10. In other words, it is possible to satisfy maximum voltage in specification between drain and source indicated in the production specification of transistor 10<breakdown voltage in second body portion 182<breakdown voltage in first body portion 181.

From the result of FIG. 6, when d=D1−D2 [μm], maximum voltage in specification between drain and source BVDSS may satisfy $BVDSS \leq 9534 \times d^4 + 7087 \times d^3 + 1970 \times d^2 + 249 \times d + 31$.

However, since the breakdown voltage in the second zone becomes excessively low when D2 becomes too shallow, there is a possibility that it is difficult to set a sufficient margin for the maximum voltage in specification of transistor 10. As stated above, when $D1 \times L2/L1 < D2$ is made to be satisfied and d=D1−D2 is adjusted, it is possible to set a sufficient breakdown voltage margin to a desired maximum voltage in specification, and at the same time to decrease the breakdown voltage in the second zone.

Moreover, in the present disclosure, no semiconductor region indicating the second conductivity type may be disposed closer to the side of the outer peripheral region of semiconductor device 1 than to second body portion 182 in the top view of semiconductor device 1. When a semiconductor region indicating the second conductivity type is disposed closer to the side of the outer peripheral region of semiconductor device 1 than to second body portion 182, main junction 18b further extends toward the side of the outer peripheral region of semiconductor device 1 accordingly. As a result, the breakdown voltage in second body portion 182 increases, which may offset the advantageous effects intended by the present disclosure.

[1-3. Method of Forming End Structure of Body Region]

Hereinafter, a method of manufacturing transistor 10 according to Embodiment 1, particularly, a method of forming an end structure of body region 18, is described.

Figure 7:
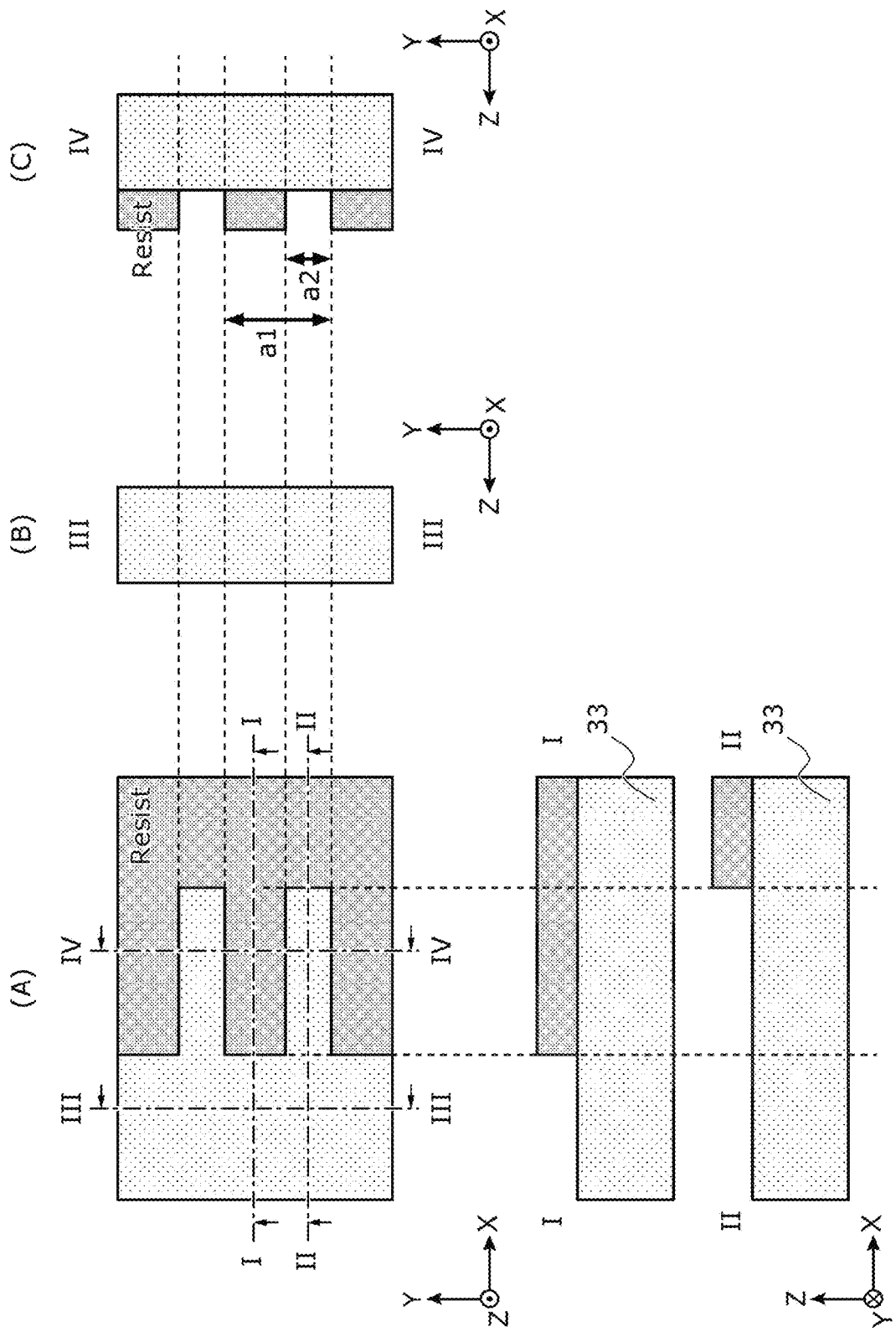
FIG. 7 is a schematic cross-sectional view showing a state of the semiconductor device according to Embodiment 1 in one step of a manufacturing process.

FIG. 7 is a schematic view showing a state immediately before impurities of the second conductivity type are injected to provide body region 18 in a process of forming a structure according to Embodiment 1.

(A) of FIG. 7 is a schematic view when semiconductor device 1 is seen in a plan (XY plan) view, and the lower portion of (A) of FIG. 7 shows schematic views when an XZ plane is seen in a cross-sectional view along line I-I and line II-II shown in (A) of FIG. 7, respectively. (B) and (C) of FIG. 7 are schematic views when a YZ plane is seen in a cross-sectional view along line III-III and line IV-IV shown in (A) of FIG. 7, respectively.

In (A), (B), and (C) of FIG. 7, in a region forming the end structure of body region 18, opening portions are alternately and periodically provided in the Y direction by patterning a resist. A pitch in the Y direction is denoted by a1 [μm], and a width of an opening portion of the resist in the Y direction is denoted by a2 [μm]. Schematic views of a state immediately after the impurities of the second conductivity type are injected in the above state are (A), (B), and (C) of FIG. 8.

Although the impurities of the second conductivity type are injected only into the opening portions of the resist in principle, when injection is performed at a limited angle, a certain amount of the impurities may also be injected into regions of semiconductor layer 40 covered with the resist. XZ cross-sectional views in the lower portion of (A) of FIG. 8 and (C) of FIG. 8 show this situation.

Schematic views of a state changed from the state shown in (A), (B), and (C) of FIG. 8 by removing the resist and subsequently performing a heat treatment are (A), (B), and (C) of FIG. 9. The injected impurities of the second conductivity type are diffused by heat, and reach a position deeper than immediately after the injection.

Figure 8:
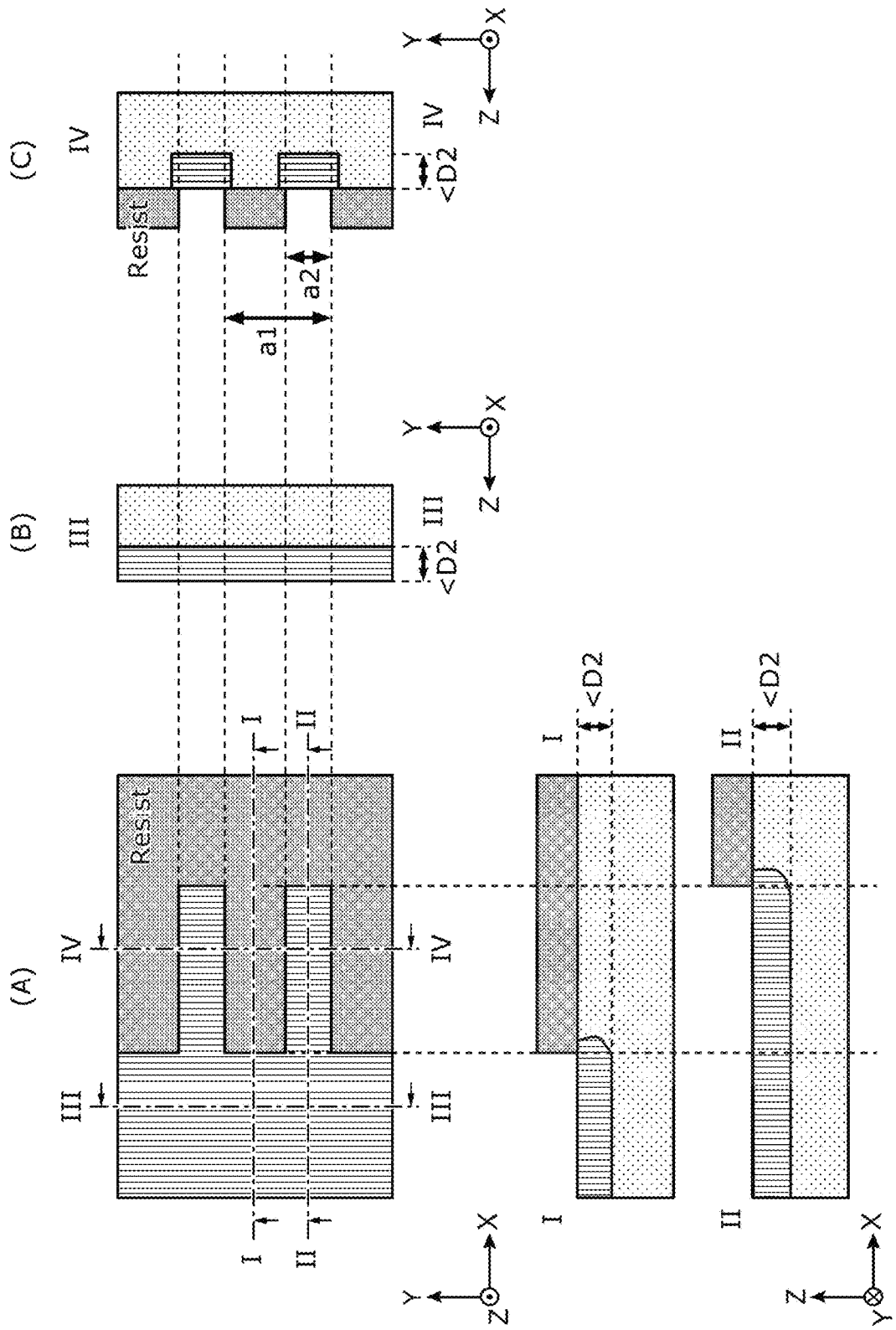
FIG. 8 is a schematic cross-sectional view showing a state of the semiconductor device according to Embodiment 1 in one step of the manufacturing process.

There is no remarkable difference in depth reached by the impurities immediately after the injection ((B) and (C) of FIG. 8), between a region whose entire length in the Y direction is not covered with the resist (line III-III) and a region in which the resist is periodically opened in the Y direction (line IV-IV) in (A) of FIG. 7.

However, when the heat treatment is performed, the impurities reach a deep position in the region whose entire length in the Y direction is not covered with the resist (line III-III), whereas the impurities are diffused from an injected region to a non-injected region not only in the Z direction but also in the Y direction in the region in which the resist is periodically opened in the Y direction (line IV-IV). As a result, the diffusion of the impurities of the second conductivity type converges at a relatively shallow position along line IV-IV, compared to line III-III.

Figure 9:
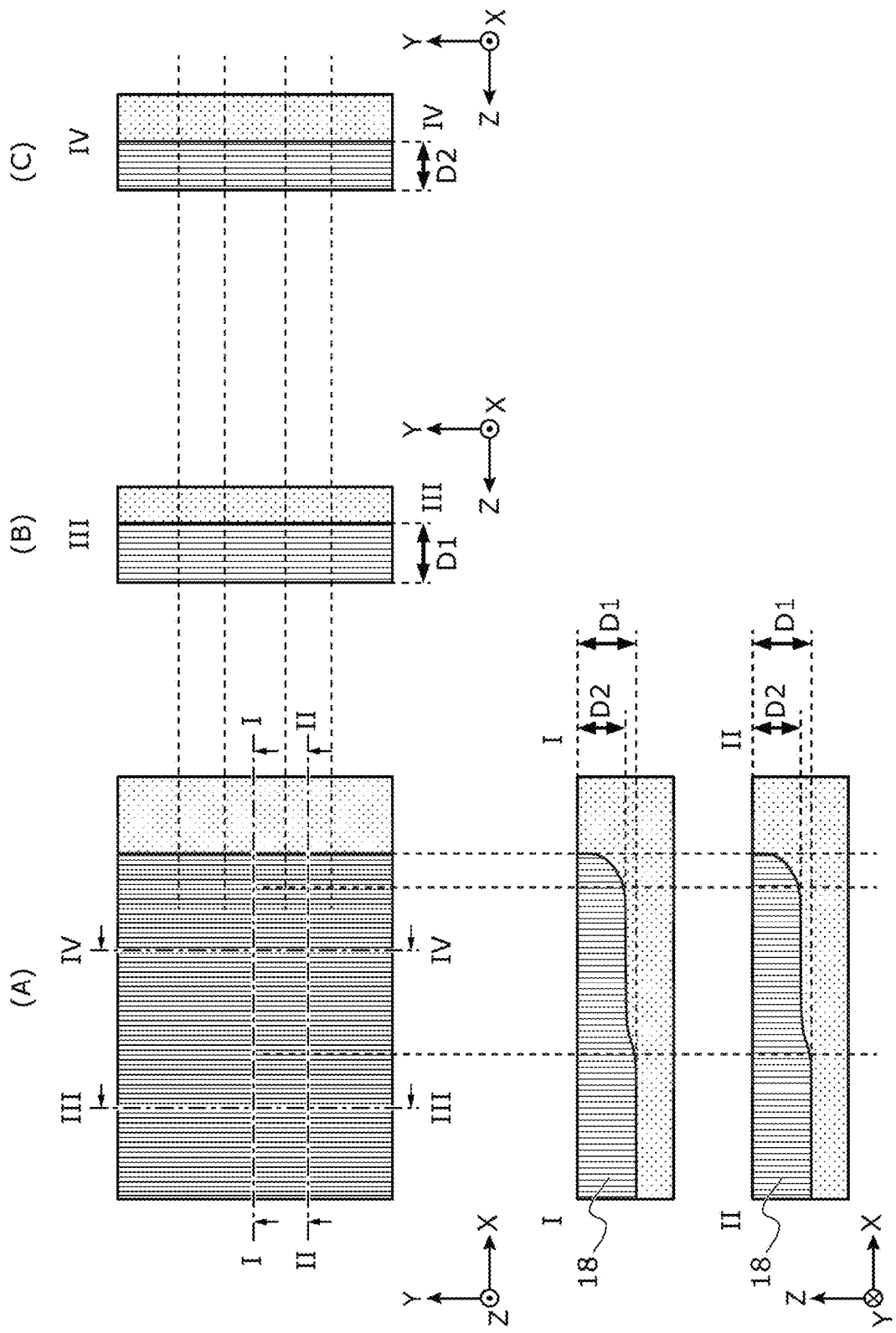
FIG. 9 is a schematic cross-sectional view showing a state of the semiconductor device according to Embodiment 1 in one step of the manufacturing process.

Accordingly, as shown in the lower portion of (A) of FIG. 9, a portion that is equivalent to second body portion 182 and in which a depth reached by the impurities of the second conductivity type is shallow is provided in an end portion of body region 18. By controlling a size such as width a2 or pitch a1 of the opening portion of the resist, injection conditions, and heat treatment conditions, it is possible to control the shape of second body portion 182, especially the shape of main junction 18b.

As stated above, since the manufacturing method according to Embodiment 1 makes it possible to provide first body portion 181 and second body portion 182 simultaneously with only a single injection of the impurities of the second conductivity type by patterning the resist in advance, the manufacturing method according to Embodiment 1 makes it possible to reduce the manufacturing cost.

According to the manufacturing method described in Embodiment 1, although there is a difference depending on the injection conditions or the thermal treatment conditions second body portion 182 includes a portion in which a region having a relatively high concentration of the impurities of the second conductivity type and a region having a relatively low concentration of the impurities of the second conductivity type are alternately and periodically present, in the plan (XY plan) view of semiconductor device 1.

Moreover, in a cross-sectional view of the YZ plane, second body portion 182 includes a portion in which a region having a relatively high concentration of the impurities of the second conductivity type and a region having a relatively low concentration of the impurities of the second conductivity type are alternately and periodically present.

Furthermore, in the cross-sectional view of the YZ plane, second body portion 182 includes a portion in which a shallow region and a deep region are alternately and periodically present in the Y direction. Here, in the same cross-sectional view, the bottom surface of second body portion 182 is in a concavo-convex shape in the Y direction.

A region having a relatively high concentration of the impurities of the second conductivity type in the plan view of semiconductor device 1 corresponds to a region in which the resist is opened in (A), (B), and (C) of FIG. 8. The region corresponds to a region having a relatively high concentration of the impurities of the second conductivity type in the cross-sectional view of the YZ plane, and further corresponds to each of deep regions of second body portion 182 periodically present in the Y direction in the cross-sectional view of the YZ plane.

Likewise, a region having a relatively low concentration of the impurities of the second conductivity type in the plan view of semiconductor device 1 corresponds to a region covered with the resist in (A), (B), and (C) of FIG. 8. The region corresponds to a region having a relatively low concentration of the impurities of the second conductivity type in the cross-sectional view of the YZ plane, and further corresponds to each of shallow regions of second body portion 182 periodically present in the Y direction in the cross-sectional view of the YZ plane.

Figure 10A:
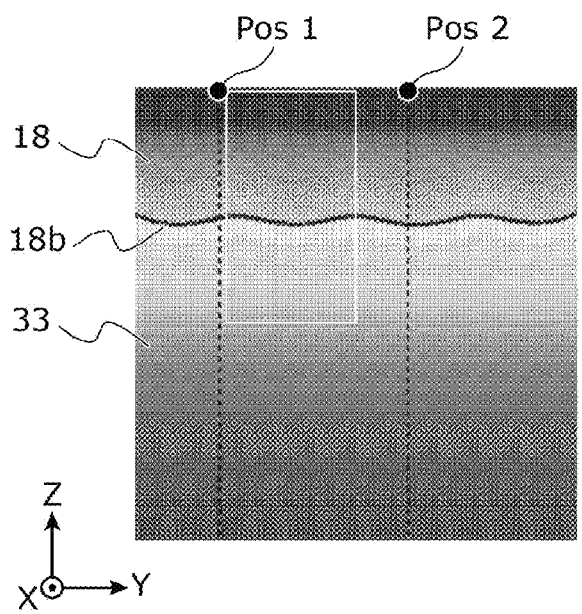
FIG. 10A is a schematic cross-sectional view showing simulation results of the structure of the semiconductor device according to Embodiment 1.

FIG. 10A shows, as an example, simulation results of a cross section, along the YZ plane, of transistor 10 manufactured by the manufacturing method. In the simulation shown in FIG. 10A, a pitch between resist patterns is 0.8 μm, and a width of an opening portion of a resist is 0.2 μm. Although also depending on manufacturing conditions, it is clear that main junction 18b is in a regular concavo-convex shape in the Y direction, and second body portion 182 includes a portion in which a shallow region and a deep region are alternately and periodically present in the Y direction.

Figure 10B:
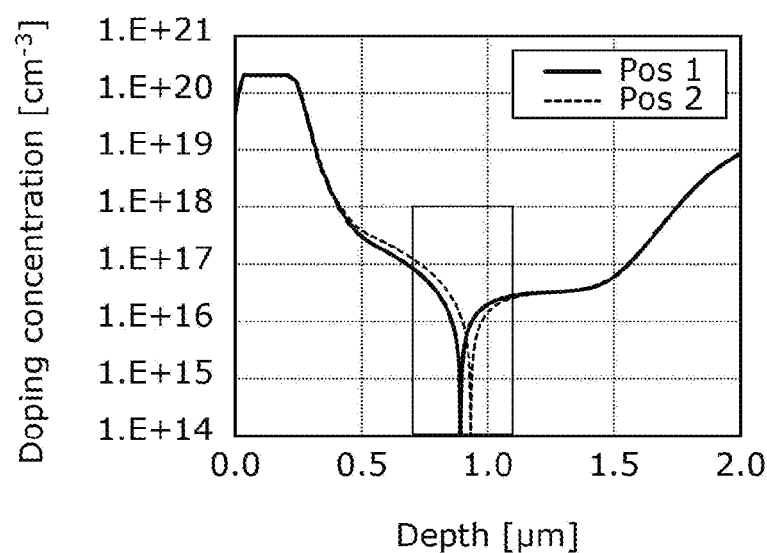
FIG. 10B is a graph obtained by plotting simulation results of a doping concentration of the semiconductor device according to Embodiment 1.
Figure 10C:
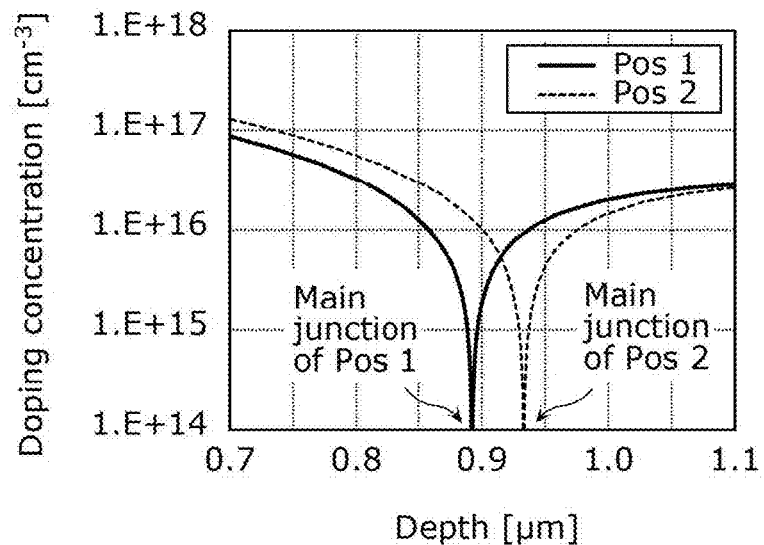
FIG. 10C is a graph obtained by plotting the simulation results of the doping concentration of the semiconductor device according to Embodiment 1, and by enlarging a portion of FIG. 10B.

FIG. 10B is a graph obtained by plotting simulation results of a doping concentration of transistor 10 manufactured by the same manufacturing method. FIG. 10C is a graph obtained by enlarging an area enclosed by a line in FIG. 10B. The horizontal axis indicates a depth from the top surface of semiconductor layer 40 (low-concentration impurity layer 33), and the vertical axis indicates a doping concentration. A doping concentration is a concentration in which a conductivity type of impurities is also factored, and has a value of zero in a portion in which a concentration of impurities of the first conductivity type and a concentration of impurities of the second conductivity type are equal since the concentrations offset each other. In other words, a portion at which a value is zero is main junction 18b.

In FIG. 10B and FIG. 10C, each of doping concentrations, in the Z direction, of a shallow region (Pos 1) and a deep region (Pos 2) of second body portion 182 shown in FIG.

10A is plotted. It is clear that a difference in depth in the Z direction appears in a range of approximately 0.04 μm to 0.05 μm under manufacturing conditions shown here as an example.

A relation between an opening size with regard to an impurity injection at the time of forming second body portion 182 and a final shape of main junction 18b is described with reference to FIG. 10D.

Figure 10D:
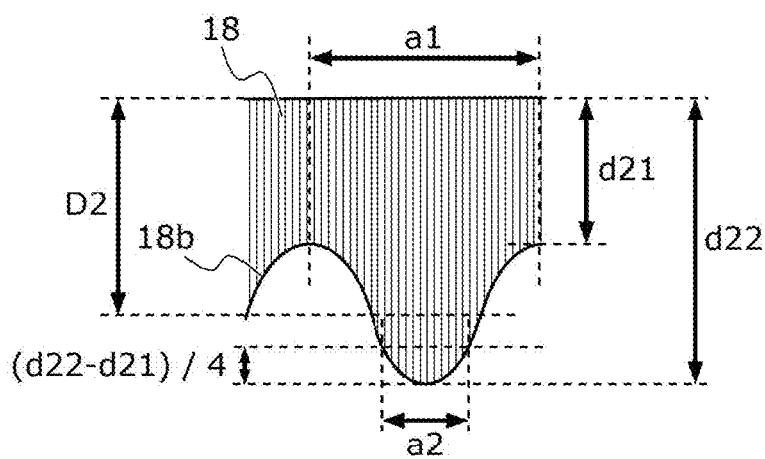
FIG. 10D is a schematic cross-sectional view showing an emphasized portion of FIG. 10A.

FIG. 10D is a schematic diagram that emphatically represents the area indicated by the white frame in FIG. 10A for the sake of understanding. The shape of main junction 18b is changed to a shape similar to a sine function in FIG. 10D, and the sizes in FIG. 10D are represented by a relation different from a relation between actual sizes.

As shown in (A) and (C) of FIG. 8, in a region forming the end structure of body region 18, opening portions are alternately and periodically provided in the Y direction by patterning a resist. When a pitch in the Y direction is denoted by a1 [μm], and a width of an opening portion of the resist is denoted by a2 [μm], a distance between adjacent local maximum points of main junction 18b corresponds to pitch a1 in FIG. 10D.

Since the impurities are injected into the opening portions of the resist in (A) and (C) of FIG. 8, each of local minimum points of main junction 18b is equivalent to the central position of a different one of the opening portions of the resist in the Y direction in FIG. 10D. Similarly, in FIG. 10D, each of local maximum points of main junction 18b is equivalent to the central position of a different one of non-opening portions of the resist in the Y direction.

In the cross-sectional view of the YZ plane, since the impurities injected into an opening portion of the resist are diffused by heat treatment into non-injected regions on the both sides of the Y direction, second body portion 182 becomes shallower from the center of the opening of the resist toward the both sides in the Y direction with a decrease in impurity concentration. Since this situation results from the diffusion of the impurities, a width of main junction 18b that changes to half of an amplitude from each local minimum point to the both sides in the Y direction is considered as approximately equal to a width into which the impurities are actually injected, that is, a width of the opening of the resist.

Accordingly, in correspondence to FIG. 10D, when a depth of a region in which second body portion 182 becomes shallower is denoted by d21 [μm], and a depth of a region in which second body portion 182 becomes deeper is denoted by d22 [μm] (d21<D2<d22 appears to be satisfied), a closest zone in which a depth of second body portion 182 is represented by d22−(d22−d21)/4 in the Y direction substantially matches width a2 of the opening portion of the resist.

Here, when n denotes the number of times an opening portion is repeatedly provided in the resist, volume L1×(a1×n)×(D1−D2) of a region in which impurities should not be injected to make second body portion 182 shallower need to be comparable with volume L1×((a1−a2)×n)×D1 of a region in which impurities are not injected since the latter region is covered with the resist in second body portion 182. For this reason, a2=a1×D2/D1 is satisfied.

In a correspondence relation with FIG. 10D, the closest zone in which the depth of second body portion 182 is represented by d22−(d22−d21)/4 in the Y direction is substantially equal to a1×D2/D1. Here, the term "substantially equal" refers to a range from half to twice as much as a value of a1×D2/D1. The range is obtained by factoring in a fluctuation due to an injection angle at the time of an impurity injection or the heat treatment conditions.

Meanwhile, the concentration of the impurities of the second conductivity type in body region 18 of transistor 10 manufactured by the manufacturing method according to Embodiment 1 slowly decreases from the top surface of low-concentration impurity layer 33 toward main junction 18b by at least one digit typically from approximately $1.0E18$ cm$^{-3}$ to approximately $1.0E16$ cm$^{-3}$. A concentration profile of the impurities of the second conductivity type is compressed to width D2 in the Z direction in second body portion 182, whereas the concentration profile falls within width D1 in the Z direction in first body portion 181. Accordingly, a concentration gradient, in the Z direction, of the impurities of the second conductivity type in second body portion 182 is greater than a concentration gradient, in the Z direction, of the impurities of the second conductivity type in first body portion 181.

Embodiment 2

[2-1. Shape of End Structure of Body Region]

Figure 11A:
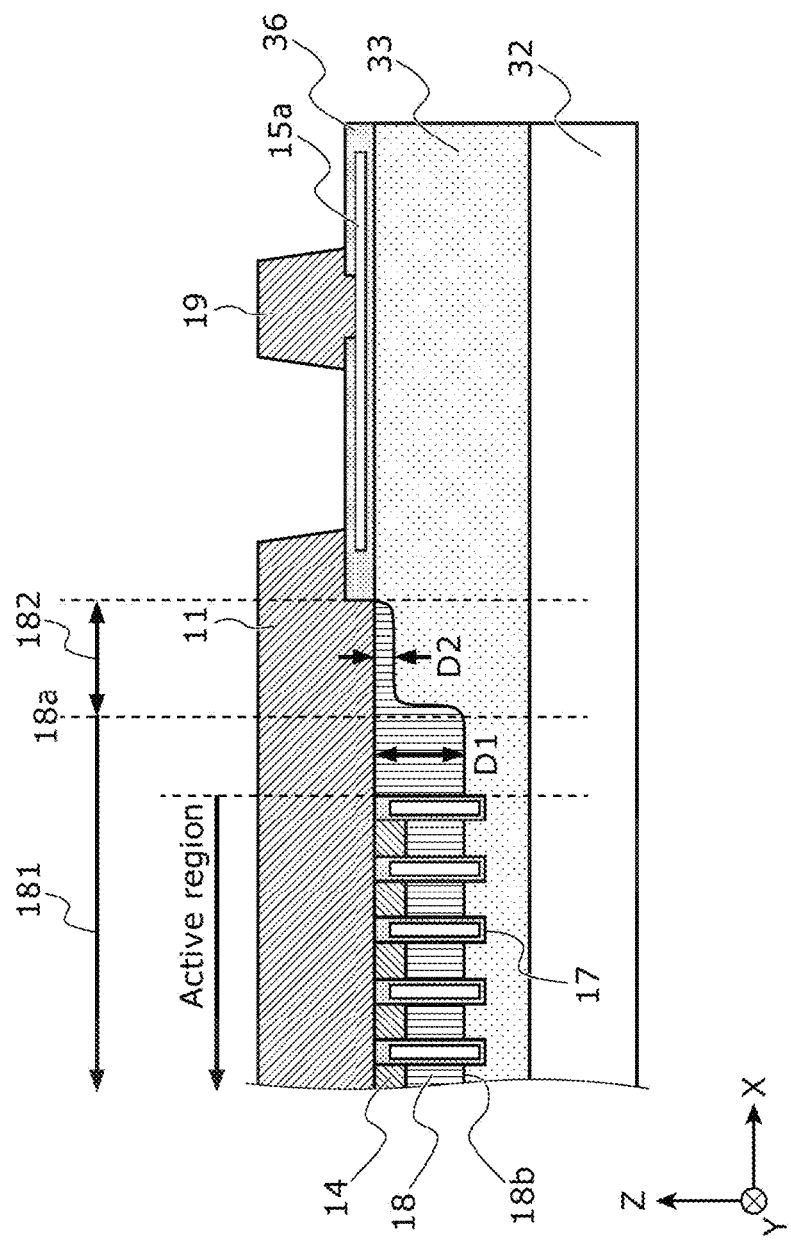
FIG. 11A is a schematic cross-sectional view showing an example of a structure in the outer periphery of a semiconductor device according to Embodiment 2.

FIG. 11A schematically shows a portion of a structure (hereinafter may be referred to as an end structure or a terminus structure) of an outer peripheral region of semiconductor device 1 according to Embodiment 2 in the X direction. In addition, FIG. 11B is a portion of FIG. 11A and is obtained by enlarging a portion of the end structure of body region 18.

It should be noted that passivation layer 35 and metal layer 30 are omitted from FIG. 11A, FIG. 11B, and FIG. 11C to be described later.

In the figures, those equivalent to the constituent elements described in Embodiment 1 are assigned the same reference signs, and the same descriptions as in Embodiment 1 are omitted.

Embodiment 2 differs from Embodiment 1 in that depth D2 in second body portion 182 is significantly less than depth D1 in first body portion 181. In an example shown in FIG. 11A, when a depth from the top surface of low-concentration impurity layer 33 to a bottom surface of first source region 14 is denoted by Ds [μm], D2<Ds<D1 is satisfied.

Additionally, Embodiment 2 is characterized in that both in first body portion 181 and second body portion 182, concentration of impurities of second conductivity type p2 [cm$^{-3}$] in a region from the top surface of low-concentration impurity layer 33 to depth D2 is significantly different from concentration of impurities of second conductivity type p1 [cm$^{-3}$] in a region from depth D2 to depth D1 in first body portion 181.

Figure 12:
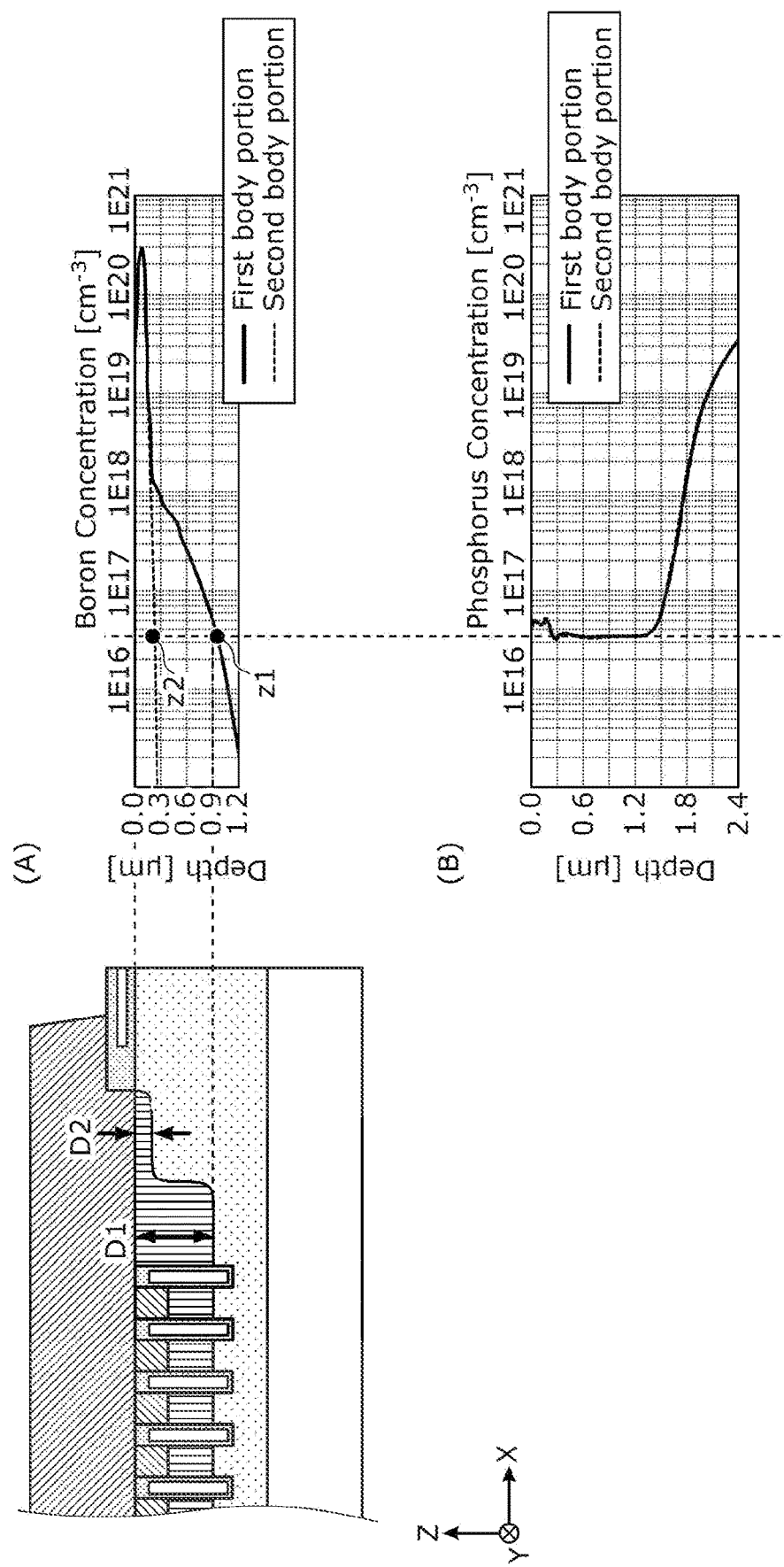
FIG. 12 is a diagram showing simulation results of a profile of impurities of a second conductivity type in each of a first body portion and a second body portion of the semiconductor device according to Embodiment 2.

(A) of FIG. 12 shows, for each of first body portion 181 (a solid line) and second body portion 182 (a dashed line) in Embodiment 2, a concentration profile of impurities of the second conductivity type in a depth direction. Moreover, (B) of FIG. 12 shows, for each of first body portion 181 (a solid line) and second body portion 182 (a dashed line), a concentration profile of impurities of the first conductivity type in the depth direction. Both (A) and (B) of FIG. 12 show data obtained using process simulations.

According to (A) of FIG. 12, the concentration profile of the impurities of the second conductivity type (the solid line) in first body portion 181 matches the concentration profile of the impurities of the second conductivity type (the dashed line) in second body portion 182, in a zone from the top surface of low-concentration impurity layer 33 to depth D2, when the concentration of the impurities of the second conductivity type is greater than or equal to 1E19 cm$^{-3}$.

In addition, according to (B) of FIG. 12, first body portion 181 (the solid line) and drift layer 33 (the dashed line) directly below second body portion 182 are equal in the concentration profile of the impurities of the first conductivity type at a position deeper than D2.

Even when impurities of the first conductivity type are present in an area, the area in which impurities of the second conductivity type having a higher concentration than the impurities of the first conductivity type are present serves as body region 18. For this reason, main junction 18b in first body portion 181 is disposed closer to a lower portion side than D2 is, down to depth D1. In contrast, second body portion 182 reaches main junction 18b at depth D2.

It should be noted that, also in Embodiment 2, a semiconductor region indicating the second conductivity type is not disposed closer to the side of the outer peripheral region of semiconductor device 1 than to second body portion 182.

Meanwhile, each of z1 and z2 in (A) of FIG. 12 indicates a point at which the concentration of the impurities of the second conductivity type in each of first body portion 181 and second body portion 182 matches the concentration of the impurities of the first conductivity type in low-concentration impurity layer 33. In other words, z1 and z2 each indicate a position of main junction 18b in a corresponding one of first body portion 181 and second body portion 182. When the concentration profile of the impurities of the first conductivity type and the concentration profile of the impurities of the second conductivity type are each obtained, it is possible to identify depth D1 of first body portion 181 and depth D2 of second body portion 182 from z1 and z2 as shown in (A) of FIG. 12, respectively.

[2-2. Effects Achieved by Providing End Structure in Body Region]

Figure 11C:
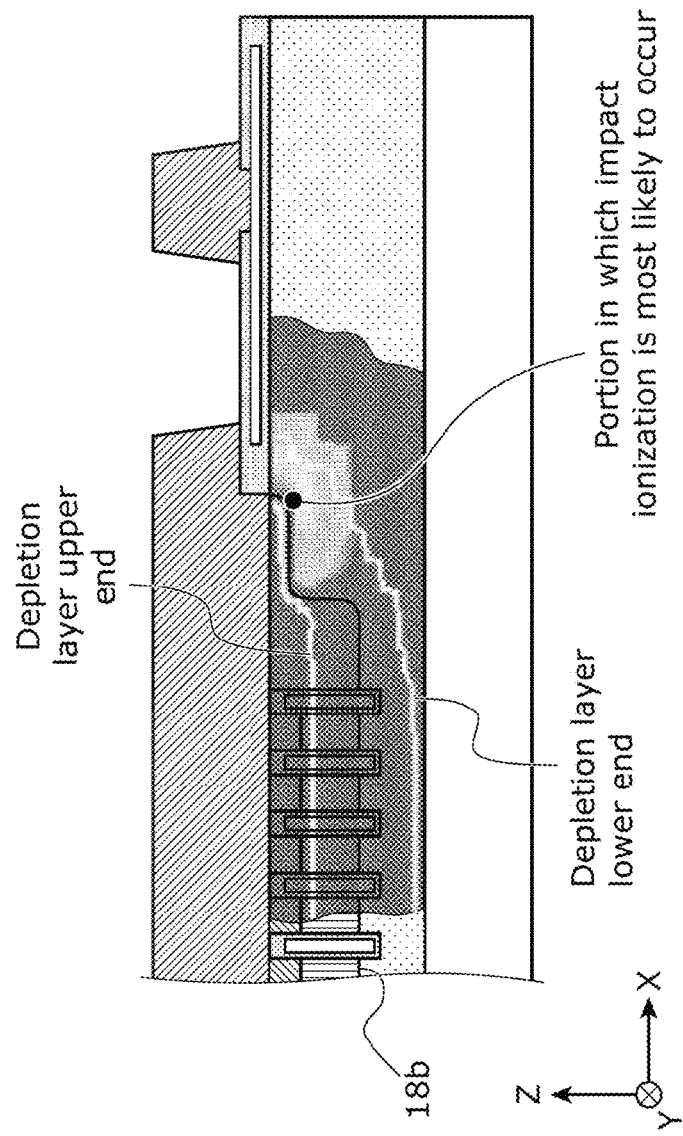
FIG. 11C is a schematic cross-sectional view obtained by superimposing simulation results of impact ionization on the structure in the outer periphery of the semiconductor device shown in FIG. 11A.

FIG. 11C shows an impact ionization image in a simulation when a rated voltage in product specification (here, 22 V) is applied between the drain and the source, using the structure shown in FIG. 11A. In FIG. 11C, a difference in impact ionization rate is shown in color shading and is partially superimposed on FIG. 11A. It is clear from the figure that in main junction 18b, a portion in which an electric field strength is greatest and at which impact ionization is likely to occur is in the second zone of second body portion 182.

Since a portion of second body portion 182 that is shallower than depth D1 of first body portion 181 has a certain length (L1>0, D2<Ds), an expansion of a depletion layer containing main junction 18b in between is limited as indicated by white lines in FIG. 11C. Since second body portion 182 especially has a high impurity concentration that is greater than or equal to 1E19 cm$^{-3}$, an expansion of the depletion layer is likely to be limited especially in the upper end.

Moreover, in the second zone from second connection point 18a2 to the side of the outer peripheral region, an equipotential line density rises due to the influence of the shape of main junction 18b, and impact ionization becomes likely to occur as a result of an increase in the electric field strength. Accordingly, the second zone of second body portion 182 has a structure in which a breakdown voltage is lowest relative to the voltage application between the drain and the source.

Figure 13A:
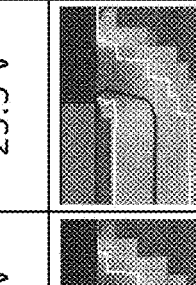
FIG. 13A is a diagram showing simulation results of impact ionization in a structure of the second body portion of the semiconductor device according to Embodiment 2, when a length of the second body portion is changed.

FIG. 13A shows simulation results of the likelihood of impact ionization when only length L1 of second body portion 182 is changed at six levels, with reference to a structure having the structure (D2<Ds) shown in FIG. 11A and the concentration profiles of the impurities shown in (A) and (B) of FIG. 12.

Figure 13B:
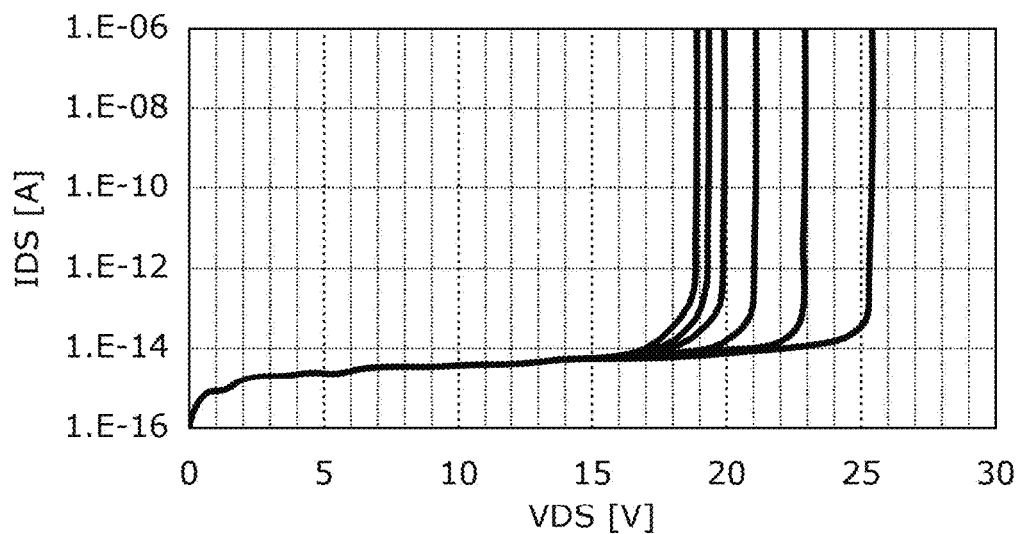
FIG. 13B is a graph showing a VDS-IDS relation in the structure of the second body portion of the semiconductor device according to Embodiment 2, when the length of the second body portion is changed.

As with FIG. 11C, FIG. 13A shows impact ionization images in simulations when a rated voltage in product specification (here, 22 V) is applied between the drain and the source. Moreover, FIG. 13B shows simulation results of a relation between VDS-IDS at each level. VDS [V] denotes a drain-source voltage, and IDS [A] denotes a drain-source current.

In FIG. 13A, lengths of second body portion 182 are 0.7 μm, 0.6 μm, 0.5 μm, 0.4 μm, 0.3 μm, and 0.2 μm in order from left to right, and all have in common that impact ionization is most likely to occur in the second zone in second body portion 182. However, a breakdown voltage increases in this order.

The VDS-IDS plot shown in FIG. 13B corresponds to the length of second body portion 182 in the same order from left to right. When VDS at IDS=1.0 μA is defined as the breakdown voltage (here BVDSS [V]) of the structure, breakdown voltages at the six levels in order from left to right are as follows: BVDSS=18.9 V, 19.3 V, 19.9 V, 21.1 V, 22.9 V, and 25.3 V. It is safe to consider that when a voltage as VDS exceeding the breakdown voltage is applied, impact ionization occurs, and a body diode undergoes avalanche breakdown. In other words, even when main junction ends have the same impurity concentration profiles or depth D1 or D2, increasing length L1 of second body portion 182 makes it possible to control a breakdown voltage of second body portion 182 in a lower way.

Level L1=0.2 μm is substantially equivalent to a case in which no portion that has constant depth D2 is present in second body portion 182. Although a state in which impact ionization is likely to occur at the end positions since the main junction ends rise vertically in a substantial manner is observed, the breakdown voltage of 25.3 V at this time is no different from a breakdown voltage of first body portion 181.

Accordingly, a breakdown voltage when second body portion 182 does not effectively perform the function intended by the present disclosure is 25.3 V. Transistor 10 operates without any trouble as long as a voltage lower than 25.3 V is applied to transistor 10; however, transistor 10 undergoes avalanche breakdown when a voltage higher than 25.3 V is applied to transistor 10. A maximum voltage in production specification of transistor 10 has to be lower than 25.3 V.

However, as shown in FIG. 13A, when second body portion 182 is provided under the condition of L1>0.2 μm, a breakdown voltage in second body portion 182 decreases. For this reason, it is possible to cause the breakdown voltage in second body portion 182 to be lower than the breakdown voltage in first body portion 181. Accordingly, since avalanche breakdown occurs in second body portion 182 before first body portion 181, it is possible to stabilize the breakdown voltage of transistor 10.

Figure 13C:
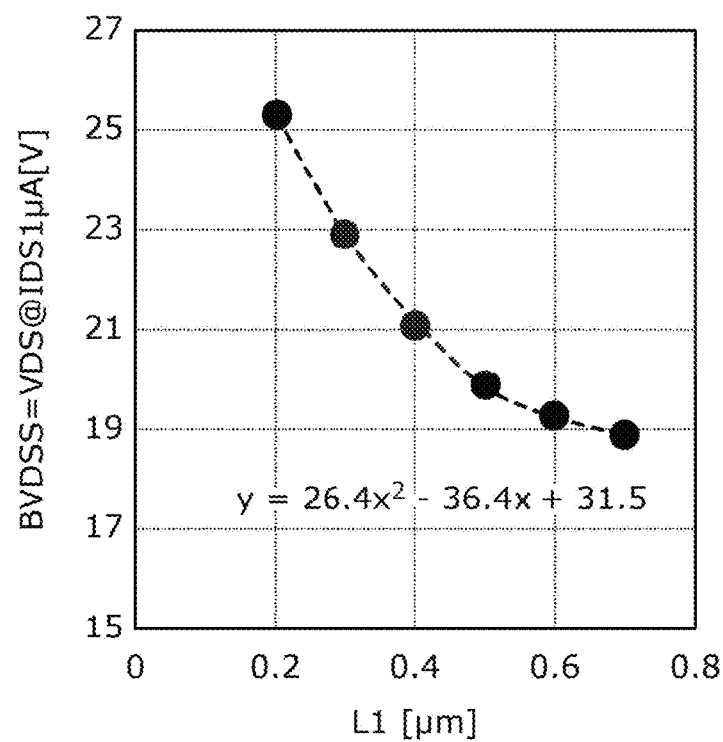
FIG. 13C is a graph showing a relation between (i) a breakdown voltage in the structure of the second body portion of the semiconductor device according to Embodiment 2 and (ii) the length of the second body portion, when the length of the second body portion is changed.

FIG. 13C is obtained by plotting the results of FIG. 13B with the horizontal axis and the vertical axis indicating L1 and BVDSS, respectively. When the results are expressed by an approximate expression, BVDSS=26.4×(L1)$^2$−36.4×L1+31.5 (L1>0.2) is derived. Accordingly, when the depths of first body portion 181 and second body portion 182 are represented by D2<Ds, and the length of second body portion 182 is greater than 0.2 μm, causing the breakdown voltage of transistor 10 to be lower than 26.4×(L1)$^2$−36.4×L1+31.5 makes it possible to satisfy a desired relation of maximum voltage in specification between drain and source of transistor 10<breakdown voltage in second body portion 182<breakdown voltage in first body portion 181.

It should be noted that the above relational expression is a result when D2<Ds<D1 and a concentration profile of impurities of the second conductivity type in an area from the top surface of low-concentration impurity layer 33 to depth D2 is similar to the concentration profile shown in (A) of FIG. 12. As shown in FIG. 11C, when the adjustment is made to further promote the impact ionization in second body portion 182, the relational expression is also satisfied. For this reason, D2<Ds may be satisfied, and the concentration profile of the impurities of the second conductivity type in the area to depth D2 higher than the concentration profile shown in (A) of FIG. 12 may be included in a portion.

As stated above, in Embodiment 2, in body region 18, the region from the top surface of low-concentration impurity layer 33 to depth D2 includes an area having a high concentration of impurities of the second conductivity type that is greater than or equal to 1E19 $cm^{-3}$. Since this high-concentration layer occupies a position at which body region 18 is in contact with source electrode 11, the high-concentration layer also serves the function of reducing a contact resistance between source electrode 11 and body region 18.

That the condition of D2<Ds unified in Embodiment 2 is also necessary for achieving the effect of reducing a contact resistance between source electrode 11 and body region 18 is stated in the description of a manufacturing method according to Embodiment 2.

It is safe to state that the high-concentration impurity layer of the second conductivity type having the function to reduce a contact resistance between source electrode 11 and body region 18 is caused to protrude in the end portion of body region 18 in Embodiment 2. As shown in FIG. 11D, the protrusion of the high-concentration impurity layer of the second conductivity type in the end portion of body region 18 may include, for example, a case in which a zone having constant depth D2 is a little.

As stated so far, by providing, in the end portion of body region 18, second body portion 182 whose length, depth, and concentration are changed, and controlling the expansion of the depletion layer, it is possible to provide a portion that causes the breakdown voltage of transistor 10 to be lowest. Second body portion 182 may be disposed to surround the outer periphery of first body portion 181 in a plan view, or may be disposed only on any sides of outer peripheral sides of first body portion 181 in a substantially rectangular shape or only on a local portion of first body portion 181.

Figure 14:
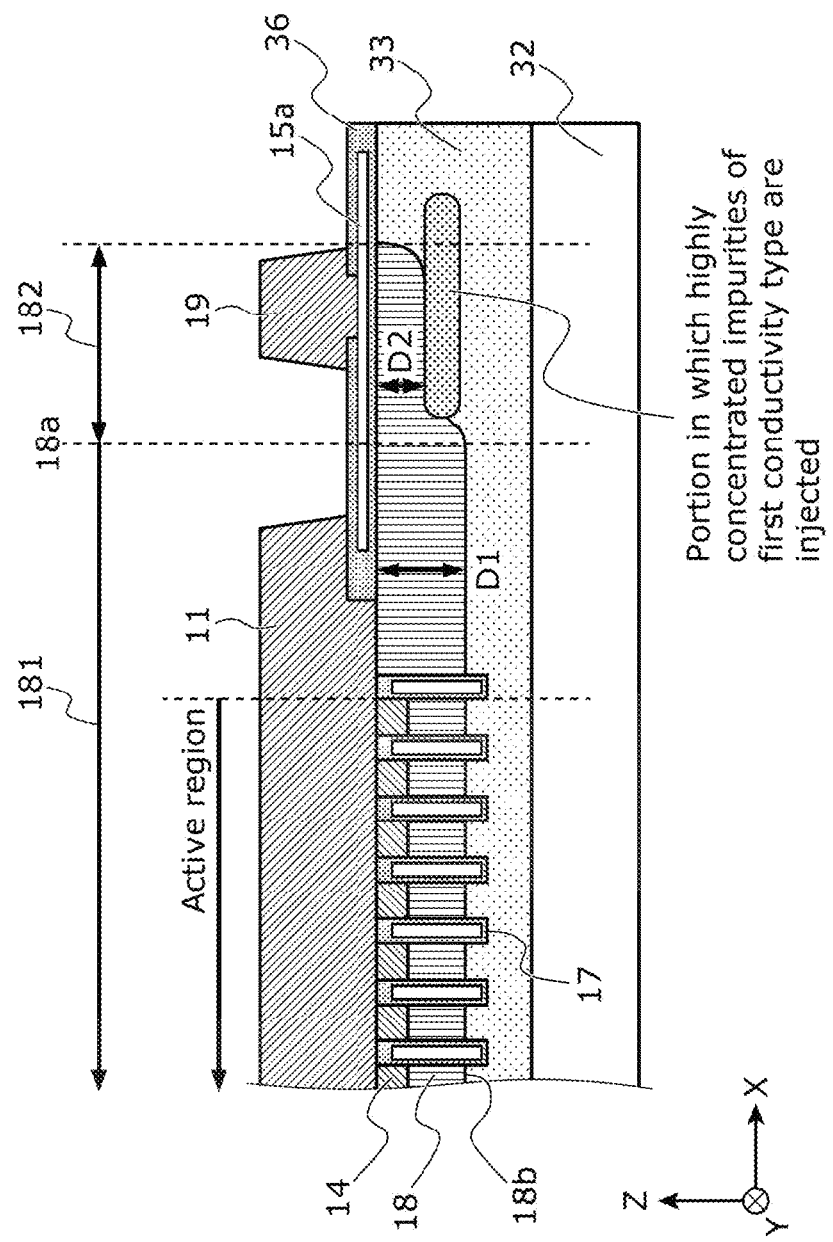
FIG. 14 is a schematic cross-sectional view showing an example of a structure in the outer periphery of a semiconductor device according to a comparative example.

FIG. 14 is a schematic diagram of a comparative example in which an end structure of a body region is formed in a structure similar to the structure in Embodiment 2. In the comparative example, those corresponding to the constituent elements of the present disclosure are also assigned with the same assigned numbers. In the comparative example, body region 18 becomes gradually shallower in the end portion of body region 18. A shallow portion is a structure equivalent to second body portion 182 in Embodiment 2. Since a portion having a higher concentration of impurities of the first conductivity type than low-concentration impurity layer 33 is only disposed directly below the structure equivalent to second body portion 182 in the comparative example, the structure is controlled, so main junction 18b is disposed at a shallow position.

In the structure of the comparative example, in the portion equivalent to second body portion 182, highly concentrated impurities are distributed both in body region 18 above main junction 18b and drift layer 33 below main junction 18b with main junction 18b being interposed therebetween. For this reason, compared to the structure of Embodiment 2, not only the upper end but also the lower end of the depletion layer do not expand easily, and impact ionization is more likely to occur. Since a breakdown voltage in the portion equivalent to second body portion 182 becomes significantly low, the structure of the comparative example is characterized by having difficulty setting a margin for the maximum voltage in specification of semiconductor device 1.

On the other hand, in the structure of Embodiment 2, since a breakdown voltage in second body portion 182 does not become extremely low, the structure of Embodiment 2 has the advantage that it is easy to set a sufficient margin for the maximum voltage in specification of semiconductor device 1.

[2-3. Method of Forming End Structure of Body Region]

Hereinafter, a method of manufacturing transistor 10 according to Embodiment 2 is described with a particular emphasis on a method of forming an end structure of body region 18.

FIG. 15A1 to FIG. 15A6 are each a schematic diagram illustrating a process of manufacturing the structure of the comparative example shown in FIG. 14. FIG. 15B1 to FIG. 15B5 are each a schematic diagram illustrating a process of manufacturing the structure of Embodiment 2.

As shown in FIG. 15A1 and FIG. 15B1, a step of processing low-concentration impurity layer 33 is common to the comparative example and Embodiment 2.

To begin with, a method of manufacturing a structure according to the comparative example is described. First, in order to provide an end structure equivalent to second body portion 182, a step of injecting, into a portion of low-concentration impurity layer 33 on which the end structure is to be provided, impurities of the first conductivity type at a concentration higher than a concentration of impurities of the first conductivity type contained in low-concentration impurity layer 33 is performed in advance (FIG. 15A2). For this step, a resist is applied to a semiconductor wafer, and an opening is provided only for the portion by an exposure process using a reticle. The injection of the impurities of the first conductivity type is performed only on the opening.

After the step shown in FIG. 15A2, only the portion into which the impurities of the first conductivity type are injected in the step shown in FIG. 15A2 is present as a portion having a different concentration of the impurities of the first conductivity type in low-concentration impurity layer 33.

Next, as shown in FIG. 15A3, in order to form body region 18 (a portion equivalent to first body portion 181 and second body portion 182), a resist is applied to the semiconductor wafer, an opening is provided for a portion in which body region 18 is to be formed, by the exposure process using a reticle, and impurities of the second conductivity type are injected through the opening.

At this time, the impurities of the second conductivity type are uniformly injected in parallel into an area forming body region 18 under the same condition. For descriptive purposes, this is referred to as a second condition in distinction from conditions for injection of impurities of the second conductivity type performed in the other subsequent steps. Under the second condition, an adjustment is made to include a portion having a concentration of the impurities of the second conductivity type lower than 1E19 $cm^{-3}$.

In the step shown in FIG. 15A3, since the impurities of the first conductivity type are already injected into the portion of low-concentration impurity layer 33 at the high concentration in the step shown in FIG. 15A2, a concentration of the impurities of the second conductivity type and a concentration of the impurities of the first conductivity type are equal at a relatively shallow position only in the portion. Accordingly, it is possible to provide main junction 18b shallow only in this portion. This results in the portion equivalent to second body portion 182 as described in Embodiment 2.

In the manufacturing method of the structure according to the comparative example, subsequently, for example, gate trench 17, gate insulating film 16, gate conductor 15, gate conductor wiring 15a that connects gate conductor 15 and gate electrode 19 formed in a subsequent step, and an interlayer insulating layer are formed. Then, as shown in FIG. 15A4, first source region 14 is formed by selectively injecting impurities of the first conductivity type from a top surface of body region 18. For the term "selectively", refer to the placement of first source region 14 shown in FIG. 3A and FIG. 3B.

After that, a body contact layer is formed by injecting, into a top surface of semiconductor layer 40, impurities of the second conductivity type at a concentration of at least 1E19 cm$^{-3}$, higher than the concentration of the impurities of the second conductivity type contained in body region 18 formed in the step shown in FIG. 15A3 (FIG. 15A5). The injection condition at this time is referred to as a first condition in distinction from the condition for injection (the second condition) performed in the step shown in FIG. 15A3. Since, in the step shown in FIG. 15A5, the resist application is not performed, and the injection is performed with oxide film 36 included in the top surface of semiconductor layer 40 being used as a mask, the first condition may be adjusted to cause the impurities of the second conductivity type not to pass through oxide film 36.

In the method of manufacturing the structure according to the comparative example, through several steps after the step shown in FIG. 15A5, source electrode 11 and gate electrode 19 are formed (FIG. 15A6), then a passivation layer etc. not shown in the figure is further formed, and finally, transistor 10 is completed.

In contrast, as shown in FIG. 15B1 to FIG. 15B5, a method of manufacturing a structure according to Embodiment 2 differs from the method of manufacturing the structure according to the comparative example in the presence or absence of some of the steps and part of the step sequence. First, the method of manufacturing the structure according to Embodiment 2 includes no step corresponding to the step of the method of manufacturing the structure according to the comparative example shown in FIG. 15A2. Moreover, in the method of manufacturing the structure according to Embodiment 2, the step of the method of manufacturing the structure according to the comparative example shown in FIG. 15A3 is delayed to FIG. 15B4.

In the method of manufacturing the structure according to Embodiment 2, from a state shown in FIG. 15B1, first, gate trench 17, gate insulating film 16, gate conductor 15, gate conductor wiring 15a that connects gate conductor 15 and gate electrode 19 formed in a subsequent step, and an interlayer insulating layer, etc. are formed.

Next, source region 14 is formed by selectively injecting impurities of the first conductivity type from a top surface of low-concentration impurity layer 33 (FIG. 15B2). This step alone is no different from the step of the method of manufacturing the structure according to the comparative example shown in FIG. 15A4.

Then, in the method of manufacturing the structure according to Embodiment 2, a body contact layer is formed (FIG. 15B3), which is equivalent to the step of the method of manufacturing the structure according to the comparative example shown in FIG. 15A5. The body contact layer forms an upper portion of body region 18. Since body region 18 is configured in two stages including the next step to be described below, the step shown in FIG. 15B3 is, so to speak, a first step of forming body region.

In the first step of forming body region (FIG. 15B3), a condition for injecting impurities of the second conductivity type at a high concentration of at least 1E19 cm$^{-3}$ is defined as a first condition. It is safe to consider that the first condition is equivalent to the injection condition in the step of the method of forming the structure according to the comparative example shown in FIG. 15A5. In the first step of forming body region (FIG. 15B3), oxide film 36 already formed on semiconductor layer 40 is used as a mask for injection. For this reason, the resist application and the exposure process in which a reticle is used are unnecessary. The first step of forming body region (FIG. 15B3) is no different from the step of the method of forming the structure according to the comparative example shown in FIG. 15A5, except that the regions into which the impurities are injected are different in a plan view.

Meanwhile, in the first step of forming body region (FIG. 15B3), it is necessary to select a condition to cause a depth at which the impurities are injected to be D2 in consideration of diffusion in heat treatment to be performed later. It is important to satisfy D2<Ds. This is because, since source region 14 is already formed at this stage, there is a possibility that satisfying D2>Ds hinders the formation of a conducting channel that is a principal function of transistor 10.

Next, in Embodiment 2, as shown in FIG. 15B4, first body portion 181 of body region 18 is formed. This is a second step of forming body region. At this time, a resist is applied to the semiconductor wafer, and an opening is provided only for a region in which first body portion 181 is formed, by the exposure process. Impurities of the second conductivity type having a concentration lower than 1E19 cm$^{-3}$ are injected through the opening of the resist under a second condition. It is safe to consider that the second condition is equivalent to the injection condition in the step of the method of manufacturing the structure according to the comparative example shown in FIG. 15A3.

A reticle used in the second step of forming body region (FIG. 15B4) is equivalent to the reticle used in the step of the method of manufacturing the structure according to the comparative example shown in FIG. 15A3.

In the second step of forming body region (FIG. 15B4), first body portion 181 is formed by injecting the impurities of the second conductivity type into a region that is, in a plan view, slightly narrower than the body contact layer already formed in the first step of forming body region (FIG. 15B3). The body contact layer in an end portion into which no impurities of the second conductivity type are injected in the second step of forming body region (FIG. 15B4) is second body portion 182.

It should be noted that the body contact layer and the high-concentration impurity layer of the second conductivity type are synonymous with each other.

Length L1 of second body portion 182 is adjusted by controlling the design of the reticle used in the second step of forming body region (FIG. 15B4). In addition, depth D2 of second body portion 182 is adjusted depending on a condition for injection of the impurities of the second conductivity type performed in the first step of forming body region (FIG. 15B3).

In the method of manufacturing the structure according to Embodiment 2, through several steps after the step shown in FIG. 15B4, source electrode 11 and gate electrode 19 are formed (FIG. 15B5), then a passivation layer etc. not shown in the figure is further formed, and finally, transistor 10 is completed.

The method of manufacturing the structure according to Embodiment 2 can be put into words as a manufacturing method of a semiconductor device that includes: performing the first step of forming body region in which impurities of the second conductivity type are injected from the top surface of low-concentration impurity layer 33 into a region forming body region 18 in a plan view under the first condition, and a portion having a concentration of impurities of the second conductivity type that is higher than or equal to 1E19 cm$^{-3}$ is formed in a zone from the top surface of low-concentration impurity layer 33 to depth D2; and subsequently performing the second step of forming body region in which a region to be first body portion 181 is selected in the plan view, impurities of the second conductivity type are injected into the region from the top surface of low-concentration impurity layer 33 under the second condition, and a portion having a concentration of impurities of the second conductivity type that is lower than 1E19 cm$^{-3}$ is formed in a zone from depth D2 to D1.

Moreover, in the manufacturing method, impurities of the first conductivity type and impurities of the second conductivity type are not injected into a portion in which second body portion 182 is formed, after low-concentration impurity layer 33 is formed and before the first step of forming body region is performed. As stated above, this makes it possible to obtain semiconductor device 1 that set a wider breakdown voltage margin for a maximum voltage in specification than the conventional comparative example.

The manufacturing method according to Embodiment 2 mainly has three advantages.

The first advantage is to omit the one step shown in FIG. 15A2 that is necessary for the comparative example to form second body portion 182. Since it is possible to reduce the number of reticles used by one, the manufacturing method is simple, and it is possible to reduce the manufacturing cost.

The second advantage is to avoid disposing second body portion 182 directly below gate conductor wiring 15a as shown in FIG. 15B5.

A voltage higher than or equal to threshold value Vth [V] is applied to gate conductor wiring 15a when transistor 10 is driven. For this reason, there is a possibility that an electric field is generated from gate conductor wiring 15a, and a breakdown voltage of second body portion 182 is deviated from a targeted design value.

However, in the structure according to Embodiment 2, oxide film 36 in direct contact with low-concentration impurity layer 33 is disposed closer to only the side of the outer peripheral region of semiconductor device 1 than to border 18a between first body portion 181 and second body portion 182 in the second direction.

Alternatively, gate conductor wiring 15a having the same electric potential as gate conductor 15 is disposed closer to only the side of the outer peripheral region of semiconductor device 1 than to second body portion 182 in the second direction.

Strictly speaking, although the second zone of second body portion 182 may be disposed directly below oxide film 36 in direct contact with low-concentration impurity layer 33 as shown in FIG. 11B, the second zone need not be disposed directly below gate conductor wiring 15a. Moreover, although first body portion 181 may be in contact with source electrode 11, first body portion 181 need not be in contact with source electrode 11 in the first zone of second body portion 182.

The above-described structure makes it possible to cause second body portion 182 to be less susceptible to the influence of the electric field generated from gate conductor wiring 15a, and to achieve the effect of stabilizing the breakdown voltage.

The third advantage is to reduce a variation in threshold value Vth for driving transistor 10 due to the structural workmanship in manufacturing.

Since, as shown in FIG. 15B2, FIG. 15B3, and FIG. 15B4, the forming of source region 14 and the forming of body region 18 (the first step of forming body region and the second step of forming body region) in transistor 10 are consecutively performed in the manufacturing method of the semiconductor device according to Embodiment 2, a state of the top surface of low-concentration impurity layer 33 remains unified during these steps. Accordingly, the injections of the impurities performed in the respective steps do not generate an individual variation with an influence from the state of the top surface of low-concentration impurity layer 33.

Figure 16A:
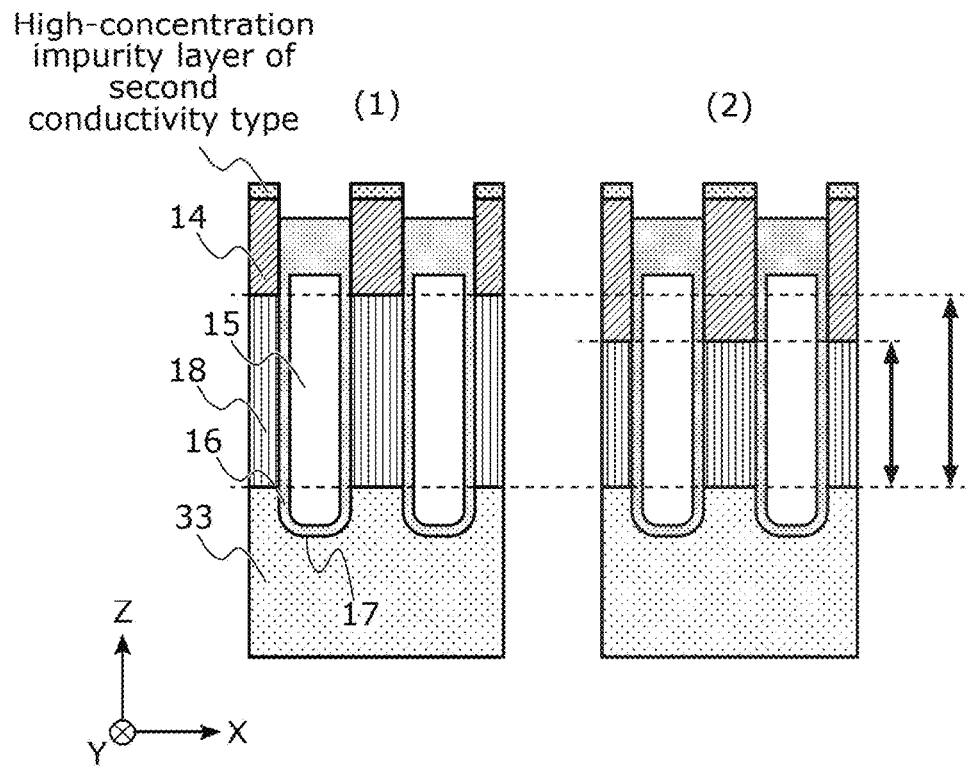
FIG. 16A is a schematic cross-sectional view showing an example of a structure of the semiconductor device according to the comparative example.
Figure 16B:
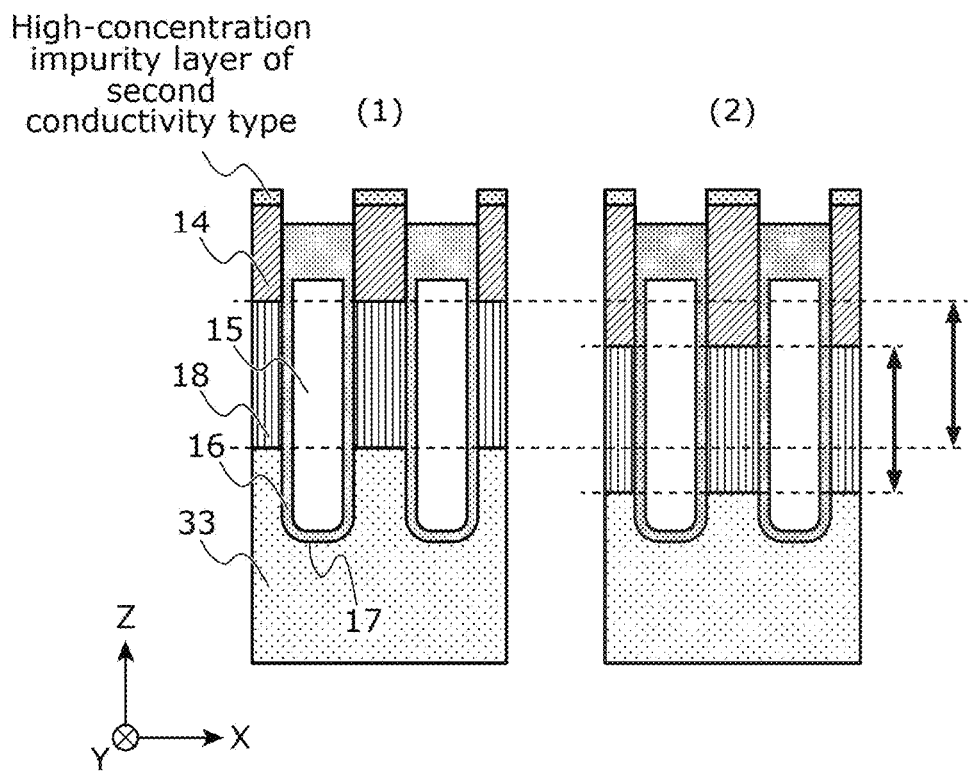
FIG. 16B is a schematic cross-sectional view showing an example of a structure of the semiconductor device according to Embodiment 2.

This is shown in (1) and (2) of FIG. 16B. The injection of the impurities of the first conductivity type performed in the forming of source region 14 (FIG. 15B2) causes the depth of source region 14 after the injection to vary even under the same injection condition, depending on a state of the top surface of low-concentration impurity layer 33. (1) of FIG. 16B shows an example in which source region 14 is formed relatively shallow in a state of the top surface. (2) of FIG. 16B shows an example in which source region 14 is formed relatively deep in another state of the top surface.

In the manufacturing method according to Embodiment 2, the first step of forming body region (FIG. 15B3) and the second step of forming body region (FIG. 15B4) are consecutively performed. However, since a state of the top surface of low-concentration impurity layer 33 is continuously constant, as with source region 14, body region 18 is also formed relatively shallow in a state of the top surface shown in (1) of FIG. 16B. As with source region 14, body region 18 is also formed relatively deep in a state of the top surface shown in (2) of FIG. 16B.

Since source region 14 and body region 18 are formed shallow or deep in the same manner in either one of the states of the top surfaces, a conducting channel length corresponding to the difference does not vary. Accordingly, it is possible to reduce the generation of a variation in threshold value Vth for driving transistor 10 due to the conducting channel length.

The state of the top surface of low-concentration impurity layer 33 also includes a variation in a plane of semiconductor device 1. However, since the manufacturing method according to Embodiment 2 responds to each state of the top surface of the portion, the manufacturing method of the semiconductor device according to Embodiment 2 achieves an effect of also reducing a variation in conducting channel length in the plane.

On the other hand, in the manufacturing method of the semiconductor device according to the comparative example, the step of forming gate trench 17, gate insulating film 16, gate conductor 15, gate conductor wiring 15a, interlayer insulating layer, etc. is inserted between the forming of body region 18 (FIG. 15A3) and the forming of source region 14 (FIG. 15A4). For this reason, a state of the top surface of low-concentration impurity layer 33 changes between a time of injecting the impurities of the second conductivity type to form body region 18 and a time of injecting the impurities of the first conductivity type to form source region 14.

This is shown in (1) and (2) of FIG. 16A. Even when the injection of the impurities of the second conductivity type performed in the forming of body region 18 (FIG. 15A3) is performed under the same condition, the depth of body region 18 after the injection varies depending on a state of the top surface of low-concentration impurity layer 33. (1) of FIG. 16A shows an example in which body region 18 is formed relatively shallow in a state of the top surface. (2) of FIG. 16A shows an example in which body region 18 is formed relatively shallow in another state of the top surface.

In the manufacturing method of the semiconductor device according to the comparative example, since the state of the top surface of low-concentration impurity layer 33 surely changes in the forming of source region 14 (FIG. 15A4) to be subsequently performed, as shown in both (1) and (2) of FIG. 16A, the depth of source region 14 is determined regardless of the depth of body region 18. Accordingly, a conducting channel length corresponding to this difference is not made uniform. Influenced by a structural workmanship variation and an in-plane variation, a considerable variation due to the conducting channel length is generated in threshold value Vth for driving transistor 10.

In other words, in the manufacturing method of the semiconductor device according to Embodiment 2, the forming of source region 14, the first step of forming body region, and the second step of forming body region may be consecutive in stated order. Transistor 10 thus formed has the conducting channel length that is constant in the plane of semiconductor device 1.

The above-described characteristics are stated differently as follows. In semiconductor device 1 according to Embodiment 2, a top surface of gate conductor 15 inside gate trench 17 is disposed above an interface between source region 14 and body region 18 in the third direction (the Z direction) orthogonal to both the first direction (the Y direction) and the second direction (the X direction), and a length from the top surface of gate conductor 15 to an interface (the main junction) between source region 14 and drift layer 33 is constant in the plane of semiconductor device 1.

Alternatively, the top surface of gate conductor 15 inside gate trench 17 is disposed above the interface between source region 14 and body region 18 in the third direction (the Z direction) orthogonal to both the first direction (the Y direction) and the second direction (the X direction), and a sum of a length from the top surface of gate conductor 15 to an interface between source region 14 and body region 18 and a length from interface (main junction 18b) between body region 18 and drift layer 33 to a tip of gate trench 17 is constant in the plane of semiconductor device 1.

It should be noted that the term "constant" does not strictly mean that a size is constant, but means that conducting channel lengths fall within a range of 10% in each of measured portions arbitrary extracted. The range of +10% does not impede achieving the advantageous effects of Embodiment 2 at all.

As above, the manufacturing method of the semiconductor device according to Embodiment 2 is superior to the manufacturing method of the semiconductor device according to the conventional comparative example due to the three advantages.

INDUSTRIAL APPLICABILITY

It is possible to widely use the semiconductor device including the vertical field-effect transistor according to the present disclosure as a device that controls the conduction state of a current path.

The invention claimed is:

1. A semiconductor device that is a facedown mountable, chip-size-package type semiconductor device, the semiconductor device comprising:
   a vertical field-effect transistor including:
      a semiconductor substrate of a first conductivity type that contains an impurity of the first conductivity type;
      a low-concentration impurity layer of the first conductivity type that is disposed on the semiconductor substrate and contains an impurity of the first conductivity type having a concentration lower than a concentration of the impurity of the first conductivity type contained in the semiconductor substrate;
      a body region of a second conductivity type that is disposed in the low-concentration impurity layer, the second conductivity type being different from the first conductivity type;
      a source region of the first conductivity type that is disposed in the body region;
      a gate trench that penetrates through the body region from a top surface of the low-concentration impurity layer to a depth that reaches a portion of the low-concentration impurity layer, and extends in a first direction parallel to the top surface of the low-concentration impurity layer;
      a gate insulating film that is disposed inside the gate trench; and
      a gate conductor that is disposed on the gate insulating film inside the gate trench,
   wherein a direction orthogonal to the first direction along the top surface of the low-concentration impurity layer is defined as a second direction, and a direction orthogonal to both the first direction and the second direction is defined as a third direction,
   the body region includes:
      a first body portion that contains an active region in which a conducting channel is provided in a plan view of the low-concentration impurity layer, and has a constant depth from the top surface of the low-concentration impurity layer; and
      a second body portion that is adjacent to the first body portion on a side of an outer peripheral region surrounding the active region in the plan view, and includes a zone that has a limited length in the second direction and a constant depth from the top surface of the low-concentration impurity layer at a position shallower than the constant depth of the first body portion, and
   the second body portion includes a portion in which a region having a relatively high concentration of an impurity of the second conductivity type and a region having a relatively low concentration of an impurity of the second conductivity type are alternately and periodically present in the first direction in a cross-sectional view of a plane including the first direction and the third direction.

2. The semiconductor device according to claim 1, wherein the second body portion includes a portion in which a shallow region and a deep region are alternately and periodically present in the first direction in the cross-sectional view of the plane including the first direction and the third direction.

3. The semiconductor device according to claim 1, wherein in a cross-sectional view of a plane including the second direction and the third direction, a depth of the first body portion is denoted by D1 [µm], a depth of the second body portion in a zone closest to the first body portion, among zones in each of which the depth of the second body portion is constant, is denoted by D2 [μm], a point that is on a bottom surface of the body region at which the depth D1 of the first body portion ends, and connects to a bottom surface of the second body portion is defined as a first connection point, and a point on the bottom surface of the second body portion farthest from the first body portion, at which the depth D2 ends, is defined as a second connection point, in the cross-sectional view of the plane including the second direction and the third direction, the depth of the second body portion monotonically decreases in the second direction, the second body portion includes:
  a first zone where the bottom surface of the second body portion changes from the first connection point to the depth D2; and
  a second zone where the bottom surface of the second body portion changes from the second connection point to a point at which the body region ends on the top surface of the low-concentration impurity layer, and D2>D1×L2/L1 is satisfied, where a length from the first connection point to a point at which the body region ends on the top surface of the low-concentration impurity layer in the second direction is denoted by L1 [μm], and a length from the second connection point to the point at which the body region ends on the top surface of the low-concentration impurity layer in the second direction is denoted by L2 [μm].

4. The semiconductor device according to claim 3, wherein when, in the cross-sectional view of the plane including the first direction and the third direction, a depth of a shallow region of the second body portion is denoted by d21 [μm], a depth of a deep region of the second body portion is denoted by d22 [μm], and a pitch is denoted by a [μm], the shallow region and the deep region being alternately and periodically present in the first direction, a closest zone in which the depth of the second body portion is represented by d22−(d22−d21)/4 in the first direction is substantially equal to a×D2/D1.

5. The semiconductor device according to claim 1, wherein a top surface of the gate conductor inside the gate trench is disposed above an interface between the source region and the body region in the third direction, and a sum of a length from the top surface of the gate conductor to the interface between the source region and the body region and a length from an interface between the body region and the low-concentration impurity layer to a tip of the gate trench is constant in a plane of the semiconductor device.

6. A semiconductor device that is a facedown mountable, chip-size-package type semiconductor device, the semiconductor device comprising:
  a vertical field-effect transistor including:
    a semiconductor substrate of a first conductivity type that contains an impurity of the first conductivity type;
    a low-concentration impurity layer of the first conductivity type that is disposed on the semiconductor substrate and contains an impurity of the first conductivity type having a concentration lower than a concentration of the impurity of the first conductivity type contained in the semiconductor substrate;
    a body region of a second conductivity type that is disposed in the low-concentration impurity layer, the second conductivity type being different from the first conductivity type;
    a source region of the first conductivity type that is disposed in the body region;
    a source electrode that is electrically connected to the body region and the source region;
    a gate trench that penetrates through the body region from a top surface of the low-concentration impurity layer to a depth that reaches a portion of the low-concentration impurity layer, and extends in a first direction parallel to the top surface of the low-concentration impurity layer;
    a gate insulating film that is disposed inside the gate trench; and
    a gate conductor that is disposed on the gate insulating film inside the gate trench, wherein a direction orthogonal to the first direction along the top surface of the low-concentration impurity layer is defined as a second direction, and a direction orthogonal to both the first direction and the second direction is defined as a third direction, the body region includes:
  a first body portion that contains an active region in which a conducting channel is provided in a plan view of the low-concentration impurity layer, and has a constant depth of D1 [μm] from the top surface of the low-concentration impurity layer; and
  a second body portion that is adjacent to the first body portion on a side of an outer peripheral region surrounding the active region in the plan view, and includes a zone that has a limited length in the second direction and a constant depth of D2 [μm] from the top surface of the low-concentration impurity layer at a position shallower than the constant depth of the first body portion, D2<Ds<D1 is satisfied, where a depth from the top surface of the low-concentration impurity layer to a bottom surface of the source region is denoted by Ds [μm], and a concentration profile of an impurity of the second conductivity type contained in the first body portion in the third direction matches a concentration profile of an impurity of the second conductivity type contained in the second body portion in the third direction, in a zone from the top surface of the low-concentration impurity layer to the depth of D2, when a concentration of an impurity of the second conductivity type is higher than or equal to $1E19\ cm^{-3}$.

7. The semiconductor device according to claim 6, wherein in a cross-sectional view of a plane including the second direction and the third direction, an oxide film in direct contact with the low-concentration impurity layer is disposed closer to a side of an outer peripheral region of the semiconductor device than to a border between the first body portion and the second body portion in the second direction.

8. The semiconductor device according to claim 7, wherein in the cross-sectional view of the plane including the second direction and the third direction, a zone in which the depth of the second body portion is constant at the depth of D2 is a zone closest to the first body portion among zones in each of which the depth of the second body portion is constant, a point that is on a bottom surface of the body region at which the depth of D1 of the first body portion ends, and connects to a bottom surface of the second body portion is a first connection point, a point on the bottom surface of the second body portion farthest from the first body portion, at which the depth of D2 ends, is a second connection point, in the cross-sectional view of the plane including the second direction and the third direction, the depth of the second body portion monotonically decreases in the second direction, the second body portion includes:
- a first zone where the bottom surface of the second body portion changes from the first connection point to the depth of D2; and
- a second zone where the bottom surface of the second body portion changes from the second connection point to a point at which the body region ends on the top surface of the low-concentration impurity layer, and in the cross-sectional view of the plane including the second direction and the third direction, the second zone of the second body portion is directly below the oxide film.

9. The semiconductor device according to claim 8, wherein a drain-source maximum voltage in specification BVDSS [V] of the semiconductor device satisfies BVDSS≤$26.4\times(L1)^2-36.4\times L1+31.5$, where a length from the first connection point to the point at which the body region ends on the top surface of the low-concentration impurity layer in the second direction is denoted by L1 [μm].

10. The semiconductor device according to claim 6, wherein in a cross-sectional view of a plane including the second direction and the third direction, a gate wiring structure having a same electric potential as the gate conductor is disposed closer to the side of the outer peripheral region of the semiconductor device than to the second body portion in the second direction.

11. The semiconductor device according to claim 6, wherein a top surface of the gate conductor inside the gate trench is disposed above an interface between the source region and the body region in the third direction, and a sum of a length from the top surface of the gate conductor to the interface between the source region and the body region and a length from an interface between the body region and the low-concentration impurity layer to a tip of the gate trench is constant in a plane of the semiconductor device.

* * * * *